(12) United States Patent
O'Donnell et al.

(10) Patent No.: US 11,940,502 B2
(45) Date of Patent: Mar. 26, 2024

(54) MAGNETIC FIELD SENSING BASED ON PARTICLE POSITION WITHIN CONTAINER

(71) Applicant: Analog Devices International Unlimited Company, Limerick (IE)

(72) Inventors: Alan J. O'Donnell, Castletroy (IE); Javier Calpe Maravilla, Algemesi (ES); Alfonso Berduque, Crusheen (IE); Shaun Bradley, Patrickswell (IE); Jochen Schmitt, Biedenkopf (DE); Jan Kubík, Limerick (IE); Stanislav Jolondcovschi, Carlow (IE); Padraig L Fitzgerald, Mallow (IE); Eoin Edward English, Pallasgreen (IE); Gavin Patrick Cosgrave, Enniscorthy (IE); Michael P. Lynch, Bruff (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/933,600

(22) Filed: Sep. 20, 2022

(65) Prior Publication Data
US 2023/0098962 A1    Mar. 30, 2023

Related U.S. Application Data

(60) Provisional application No. 63/261,614, filed on Sep. 24, 2021.

(51) Int. Cl.
*G01R 33/02* (2006.01)
*G01R 33/12* (2006.01)

(52) U.S. Cl.
CPC ..... *G01R 33/0213* (2013.01); *G01R 33/1207* (2013.01)

(58) Field of Classification Search
CPC .......................... G01R 33/0213; G01R 33/1207
USPC ........................................................ 324/210
See application file for complete search history.

(56) References Cited

U.S. PATENT DOCUMENTS

| | | | |
|---|---|---|---|
| 3,956,938 A | 5/1976 | Carrico |
| 3,970,112 A | 7/1976 | Bernard |
| 4,267,509 A | 5/1981 | Graham |
| 4,686,469 A | 8/1987 | Lewis |
| 4,906,877 A | 3/1990 | Ciaio |
| 5,502,378 A | 3/1996 | Atteberry et al. |

(Continued)

FOREIGN PATENT DOCUMENTS

| | | |
|---|---|---|
| CN | 102737803 | 10/2012 |
| CN | 1041133606 | 11/2014 |

(Continued)

OTHER PUBLICATIONS

Charles, S., and J. Popplewell. "The magnetic properties of ferromagnetic liquids containing iron particles in mercury." IEEE Transactions on Magnetics 12.6 (1976): 795-797. (Year: 1976).*

(Continued)

*Primary Examiner* — Christopher P McAndrew
(74) *Attorney, Agent, or Firm* — Knobbe, Martens, Olson & Bear, LLP

(57) ABSTRACT

Aspects of this disclosure relate to one or more particles that move within a container in response to a magnetic field. A measurement circuit is configured to output an indication of the magnetic field based on position of the one or more particles.

20 Claims, 28 Drawing Sheets

SIDE VIEW/CROSS-SECTION

(56) References Cited

U.S. PATENT DOCUMENTS

| | | | |
|---|---|---|---|
| 6,159,378 | A | 12/2000 | Holman et al. |
| 6,392,562 | B1 | 5/2002 | Boston et al. |
| 6,623,984 | B1 | 9/2003 | Fleischman et al. |
| 6,764,861 | B2 | 7/2004 | Prinz et al. |
| 6,982,501 | B1 | 1/2006 | Kotha et al. |
| 7,446,524 | B2 | 11/2008 | Tondra |
| 7,575,934 | B2 | 8/2009 | Atwood |
| 7,609,054 | B2 | 10/2009 | Tondra et al. |
| 7,892,856 | B2 | 2/2011 | Grate et al. |
| 8,011,424 | B2 | 9/2011 | Murray |
| 8,190,372 | B2 | 5/2012 | Kahlman et al. |
| 8,283,912 | B2 | 10/2012 | Nieuwenhuis et al. |
| 8,339,370 | B2 | 12/2012 | Yun et al. |
| 8,400,410 | B2 | 3/2013 | Taylor et al. |
| 8,453,505 | B2 | 6/2013 | Erdler et al. |
| 8,689,981 | B2 | 4/2014 | Stone et al. |
| 8,779,532 | B2 | 7/2014 | O'Donnell et al. |
| 8,815,610 | B2 | 8/2014 | Berman et al. |
| 9,041,150 | B2 | 5/2015 | O'Donnell et al. |
| 9,098,141 | B2 | 8/2015 | Ciesla et al. |
| 9,103,824 | B2 | 8/2015 | Ovsyanko |
| 9,157,891 | B2 | 10/2015 | Ovsyanko et al. |
| 9,304,131 | B2 | 4/2016 | Ovsyanko |
| 9,678,064 | B2 | 6/2017 | Djennati et al. |
| 9,737,244 | B2 | 8/2017 | Ziaie et al. |
| 9,786,969 | B2 | 10/2017 | Masias |
| 9,841,421 | B2 | 10/2017 | Dittmer et al. |
| 9,999,369 | B2 | 6/2018 | Ziaie et al. |
| 10,092,903 | B2 | 10/2018 | Prins et al. |
| 10,145,906 | B2 | 12/2018 | O'Donnell et al. |
| 10,324,481 | B2* | 6/2019 | Dahl .................. G05F 3/262 |
| 10,473,698 | B2* | 11/2019 | Dahl .................. G01R 19/0038 |
| 10,620,151 | B2 | 4/2020 | Berduque et al. |
| 10,627,269 | B2 | 4/2020 | Mazumdar et al. |
| 10,730,743 | B2 | 8/2020 | Kierse et al. |
| 10,733,906 | B2 | 8/2020 | Pascall |
| 10,809,195 | B2 | 10/2020 | Krishnamoorthy et al. |
| 10,967,122 | B2 | 4/2021 | Cima |
| 11,035,498 | B2 | 6/2021 | Alfadhel et al. |
| 11,085,554 | B2 | 8/2021 | Mou et al. |
| 11,119,161 | B2 | 9/2021 | Iwasaki et al. |
| 11,127,716 | B2 | 9/2021 | McGeehan et al. |
| 11,188,111 | B2* | 11/2021 | Lintonen .......... G01R 19/16538 |
| 11,214,061 | B2 | 1/2022 | Glusti et al. |
| 11,228,310 | B2 | 1/2022 | Zhao et al. |
| 11,231,635 | B2 | 1/2022 | Moon et al. |
| 11,307,055 | B2 | 4/2022 | Schmitt |
| 11,363,427 | B2 | 6/2022 | Volkerink et al. |
| 11,509,304 | B2* | 11/2022 | Wulff ................ H03K 17/6871 |
| 11,525,820 | B2 | 12/2022 | Meier et al. |
| 2008/0060710 | A1 | 3/2008 | Carlson et al. |
| 2008/0128391 | A1 | 6/2008 | Chen et al. |
| 2009/0221900 | A1* | 9/2009 | Ikushima ............ A61B 5/7203 600/409 |
| 2010/0117772 | A1* | 5/2010 | Van Lankvelt ........ G01R 33/12 335/219 |
| 2011/0206560 | A1 | 8/2011 | Neijzen et al. |
| 2011/0304326 | A1* | 12/2011 | Sandhu ............. G01R 33/0213 324/214 |
| 2016/0064126 | A1 | 3/2016 | Timonen et al. |
| 2017/0328931 | A1 | 11/2017 | Zhang et al. |
| 2018/0017640 | A1* | 1/2018 | Goodwill ............... G01N 27/72 |
| 2019/0135614 | A1 | 5/2019 | Kierse et al. |
| 2020/0072783 | A1 | 3/2020 | Berney et al. |
| 2021/0148850 | A1 | 5/2021 | Berduque et al. |
| 2021/0262973 | A1 | 8/2021 | Berduque et al. |
| 2021/0322681 | A1 | 10/2021 | Bolognia et al. |
| 2022/0362778 | A1* | 11/2022 | Foster .................. C12Q 1/6874 |

FOREIGN PATENT DOCUMENTS

| | | |
|---|---|---|
| CN | 205404333 | 7/2016 |
| CN | 108957365 A | 12/2018 |
| CN | 111600456 | 8/2020 |
| CN | 110671957 | 5/2021 |
| FR | 2671870 | 7/1992 |
| JP | S61108915 A | 5/1986 |
| KR | 1020150088682 | 8/2015 |
| RU | 2709703 C1 | 12/2019 |
| TW | 201348727 A | 12/2013 |
| WO | WO 2006/122203 | 11/2006 |
| WO | WO 2021/081103 | 4/2021 |

OTHER PUBLICATIONS

Al-Hetlani et al., "Continuous magnetic droplets and microfluidics: generation, manipulation, synthesis, and detection", Microchim Acta, 186, 55, 2019.

Boehler et al., "Sensors in the Autoclave-Modelling and Implementation of the IoT Steam Sterilization Procedure Counter", Sensors, 2021, 21(510) 1-17.

Bruls et al., "Rapid integrated biosensor for multiplexed immunoassays based on actuated magnetic nanoparticles", Lab Chip, 2009, pp. 3504-3510.

Cao et al., "Recent advances in manipulation of micro- and nano-objects with magnetic fields at small scales", Materials Horizons, 2020, 7, pp. 638-666.

Campos et al., "Technologies applied in the monitoring and control of the temperature in the Cold Chain", IEEE, 2018, in 6 pages.

Chae et al., "Bimodal neural probe for highly co-localized chemical and electrical monitoring of neural activities in vivo", Biosensors and Bioelectronics, 2021, vol. 191, pp. 1-11.

Chihiro et al., "Development of Molecular Interaction Assay Using Magneto-Resistance Sensor", The 42nd Annual Meeting of the Molecular Biology Society of Japan, Dec. 2019.

D'Uva et al., "Batteryless Wireless Temperature/Humidity Sensor for Item-level Smart Pharma Packaging", IEEE, 2021, pp. 145-149.

Gaster et al., "Matrix-insensitive protein assays push the limits of biosensors in medicine", Nature Medicine, Nov. 2009, 15(11): 1327-1333.

Ji et al., "An Online Cold-Chain Monitoring System Powered by Miniature Smart Tag and Blockchain", IEEE 5th International Conference on Universal Village, 2020, in 5 pages.

Juncker et al., "Cross-reactivity in antibody microarrays and multiplexed sandwich assays: shedding light on the dark side of multiplexing", Current Opinion in Chemical Biology, 2014, vol. 18, pp. 29-37.

Osterfeld et al., "MagArray Biochips for Protein and DNA Detection with Magnetic Nanotags: Design, Experiment, and Signal-to-Noise Ratio", Chapter 15 of Microarrays, 2008, pp. 299-314.

Shafiq et al., "A Battery-Free Temperature Sensor with Liquid Crystal Elastomer Switching Between RFID Chips", IEEE Access, May 21, 2020, vol. 8, pp. 87870-87883.

Wang et al., "Advances in Giant Magnetoresistance Biosensors with Magnetic Nanoparticle Tags: Review and Outlook", IEEE, Jul. 2008, 44(7): 1687-1702.

Wanganoo et al., "Real-Time Data Monitoring in Cold Supply Through NB-IoT", IEEE, Jul. 1-3, 2020, in 6 pages.

Xu et al., "Giant magnetoresistive biochip for DNA detection and HPV genotyping", Biosensors and Bioelectronics, Sep. 15, 2008, vol. 24, pp. 99-103.

Xu et al., "Giant Magnetoresistive Sensors for DNA Microarray", IEEE, Nov. 2008, 44(11): 3989-3991.

Yu et al., "Giant magnetoresistive biosensors for molecular diagnosis: surface chemistry and assay development", Proceedings of SPIE 7035, Biosensing, Aug. 29, 2008.

Yu et al., "Magnetic sensors as a novel multiplex immunoassay platform with high sensitivity", MagArray.

Yu et al., "Sensitive detection of cTnI in whole blood on MagArray biosensors", MagArray.

Yu et al., "Multiplex Autoantibody Detection Using MagArray GMR Biosensors", MagArray.

Zhang et al., "A perspective on magnetic microfluidics: Towards an intelligent future", Biomicrofluidics, 2022, vol. 16, in 9 pages.

(56) References Cited

OTHER PUBLICATIONS

Zheng et al., "A Disposable Array Chip using Temperature-Responsive Color Change to Record Temperature History in Terminal Cold Chain Transportation", IEEE, Jun. 23-27, 2019, pp. 1941-1944.
Zhou et al., "Self-powered Continuous Time-Temperature Monitoring for Cold-Chain Management", IEEE, 2017, pp. 879-882.
Adeyiga et al., "Magnetic microparticle concentration and collection using a mechatronic magnetic ratcheting system", PLOS One, Feb. 18, 2021, pp. 1-15.
Berkelman et al., "Electromagnetic Haptic Feedback System for Use With a Graphical Display Using Flat Coils and Sensor Array", IEEE Robotics and Automation Letters, Apr. 2020, vol. 5, No. 2, pp. 1618-1625.
Datta, P., "Magnetic Gels", Polymeric Gels, 2018, pp. 441-465.
Germano et al., "A Portable and Autonomous Magnetic Detection Platform for Biosensing", Sensors, May 27, 2009, 9:4119-4137.
Gomez-Pastora et al., "Optimization of Magnetic Blood Cleansing Microdevices", Microfluidics Archives—Flow-3D, pp. 1-24. (accessed Oct. 1, 2021).
Hellebrekers et al., "Soft Magnetic Skin for Continuous Deformation Sensing", Advanced Intelligent Systems, Jul. 25, 2019, 1900025, pp. 1-6.
Kabe et al., "Application of high-performance magnetic nanobeads to biological sensing devices", Analytical and Bioanalytical Chemistry, Jan. 9, 2019, 411:1825-1837.
Le et al., "Inkjet-Printed Graphene for Flexible Micro-Supercapacitors", IEEE, Aug. 15-18, 2011, pp. 67-71.
Lee et al., "Experimental Investigation of Magnetic Particle Movement in Two-Phase Vertical Flow under an External Magnetic Field Using 2D LIF-PIV", Applied Sciences, Jun. 8, 2020, 10, 3976, pp. 1-17.
Lee et al., "Thermomagnetic Convection of Ferrofluid in an Enclosure Channel with an Internal Magnetic Field", Micromachines, Aug. 21, 2019, 10, 553, pp. 1-8.
"Magnetic Separation of Sepsis Pathogen Out of Infected Blood" Medgadget Editors, Mar. 25, 2009.
Maity et al., "Manipulation of Magnetic Properties by Tunable Magnetic Dipoles in a Ferromagnetic Thin Film", IEEE Magnetic Letters, Mar. 21, 2017, vol. 8, in 4 pages.
Mohapatra et al., "Electric Stimulus-Responsive Chitosan/MNP Composite Microbeads for Drug Delivery System", IEEE Transactions on Biomedical Engineering, Jan. 2020, vol. 67, No. 1, pp. 226-233.
Mohammadi et al., "Fingertip Force Estimation via Inertial and Magnetic Sensors in Deformable Object Manipulation" IEEE, Apr. 8-11, 2016, pp. 284-289.
Ngyuen, N.T., "Micro-magnetofluidics: Interactions between magnetism and fluid flow on the microscale", Microfluidics and Nanofluidics, Nov. 16, 2011, in 17 pages.
"Polystyrene Magnetic Particles", MagSphere Inc. (—accessed Oct. 1, 2021).
Rife et al., "Design and performance of GMR sensors for the detection of magnetic microbeads in biosensors", For Sensors and Actuators A, Mar. 19, 2003, in 34 pages.
Shanko et al., Microfluidic Magnetic Mixing at Low Reynolds Numbers and in Stagnant Fluids, Micromachines, Oct. 29, 2019, 10, 731, pp. 1-23.
Sigma-Aldrich, List of Polystyrene Bead Products, available at: https://www.sigmaaldrich.com/US/en/search/polystyrene?focus=products&page=1&perpage=30&sort=relevance&term=polystyrene&type=product (accessed Oct. 1, 2021).
Tian, B., "Magnetic Nanoparticle Based Biosensors for Pathogen Detection and Cancer Diagnostics", Digital Comprehensive Summaries of Uppsala Dissertations from the Faculty of Science and Technology 1647, May 4, 2018, in 56 pages.
"Use of Paraffin Wax with Different Melting Points", King Honor International, Jun. 17, 2019.
Wang et al., "A Mechanically Tunable Artificial Magnetic Conductor using 3-D Printing Technology", IEEE, Sep. 25-27, 2018, in 4 pages.
Yunas et al., "Polymer-Based MEMS Electromagnetic Actuator for Biomedical Application: A Review", Polymers, May 22, 2020, 12, 1184, pp. 1-21.
Yasui et al., "Magnetic Micro Actuator with Neutral Buoyancy and 3D Fabrication of Cell Size Magnetized Structure" IEEE, May 14-18, 2012, pp. 745-750.
International Search Report issued in International Application No. PCT/EP2022/076523, dated Jan. 20, 2023.
Written Opinion issued in International Application No. PCT/EP2022/076523, dated Jan. 20, 2023.

\* cited by examiner

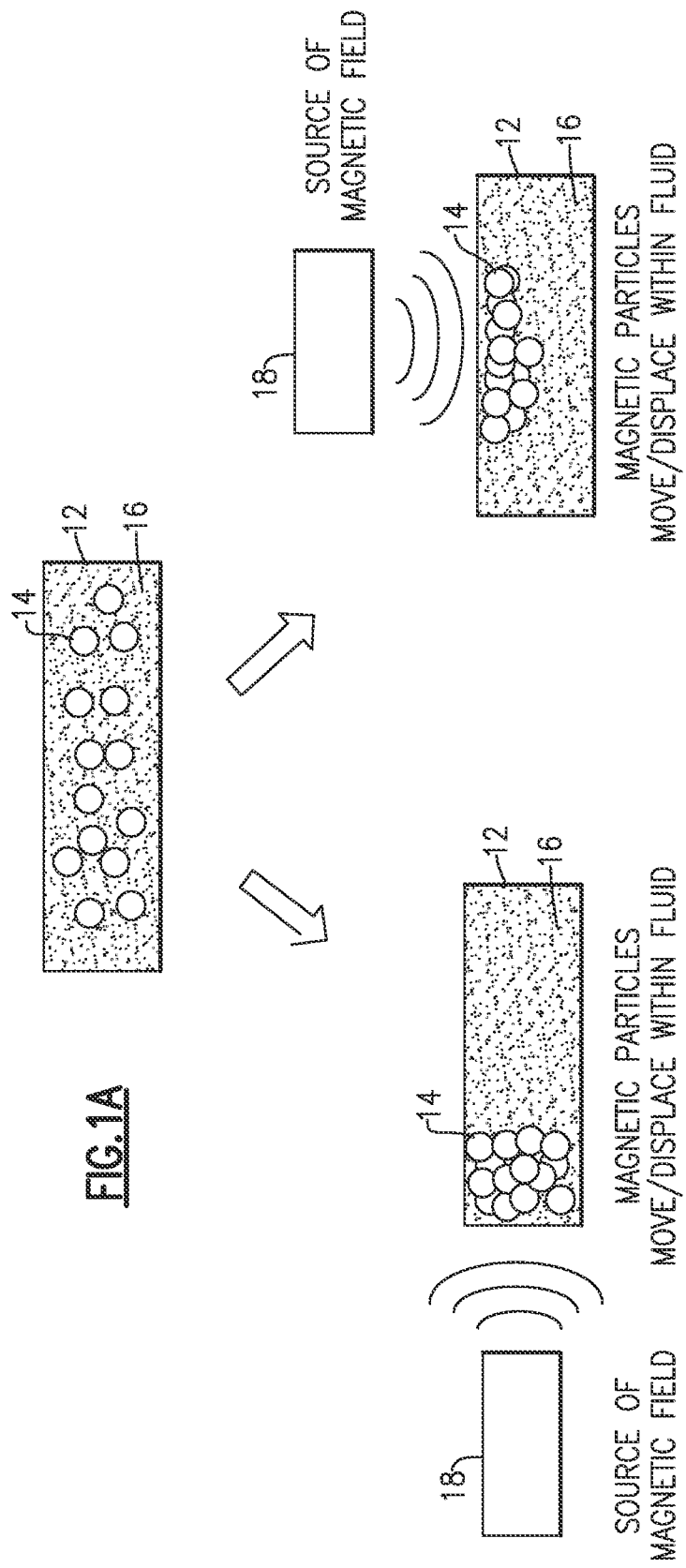

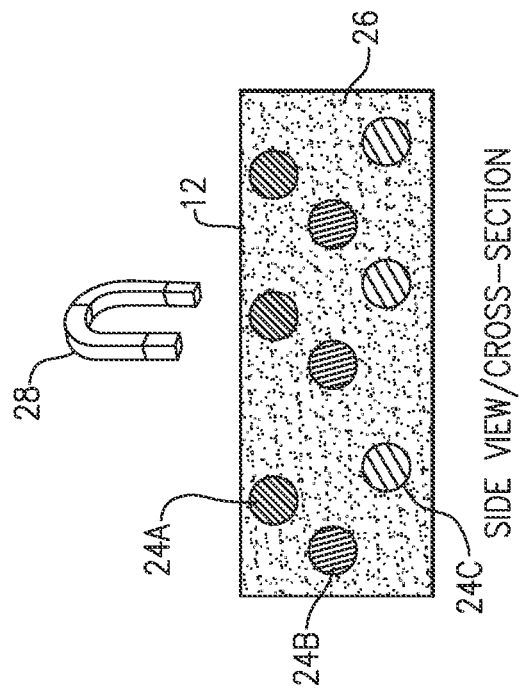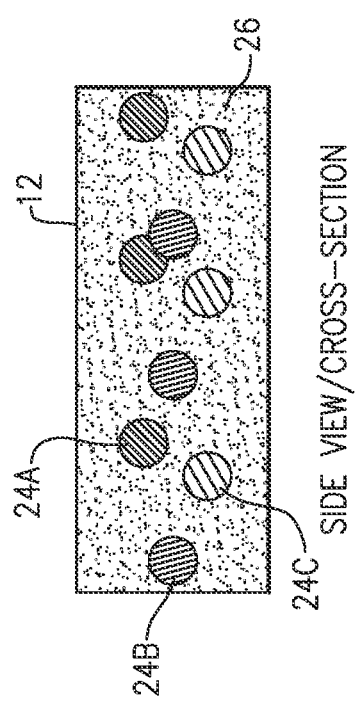

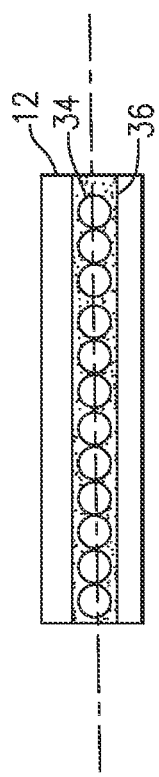
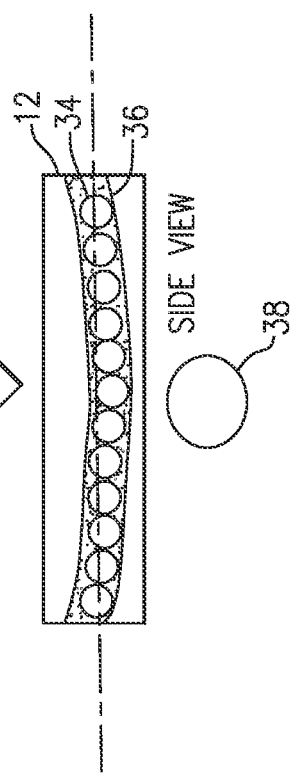
FIG. 3A
FIG. 3B

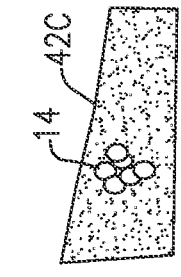
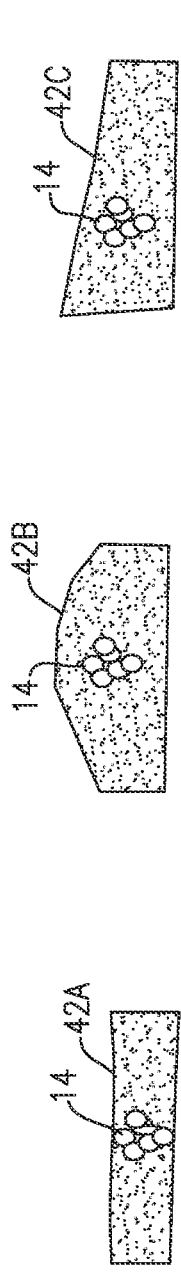
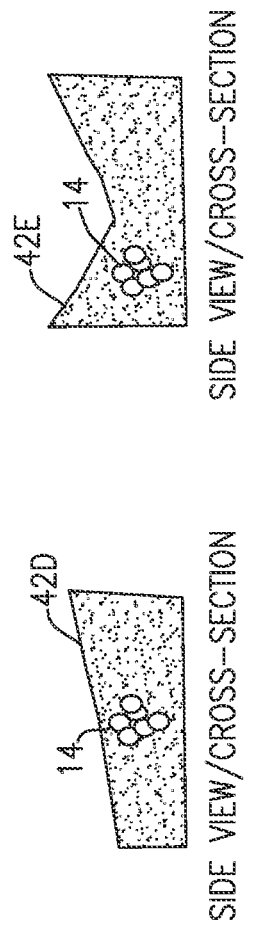

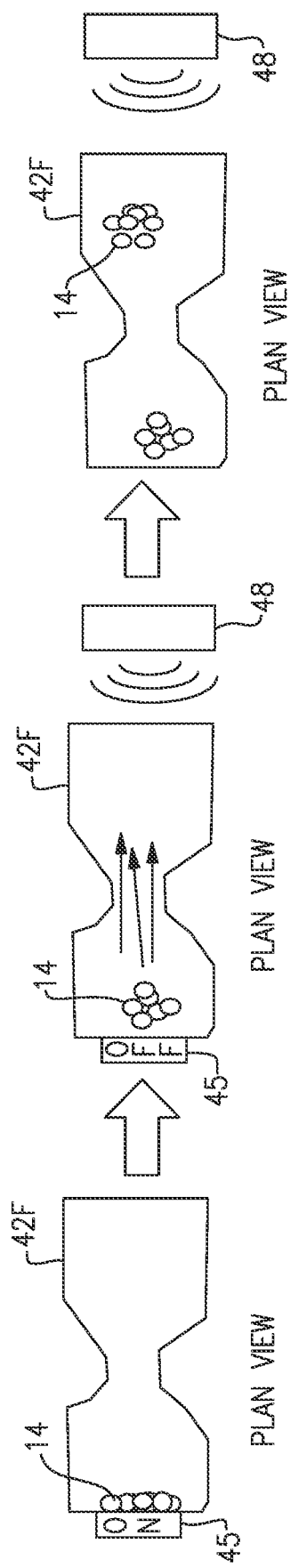

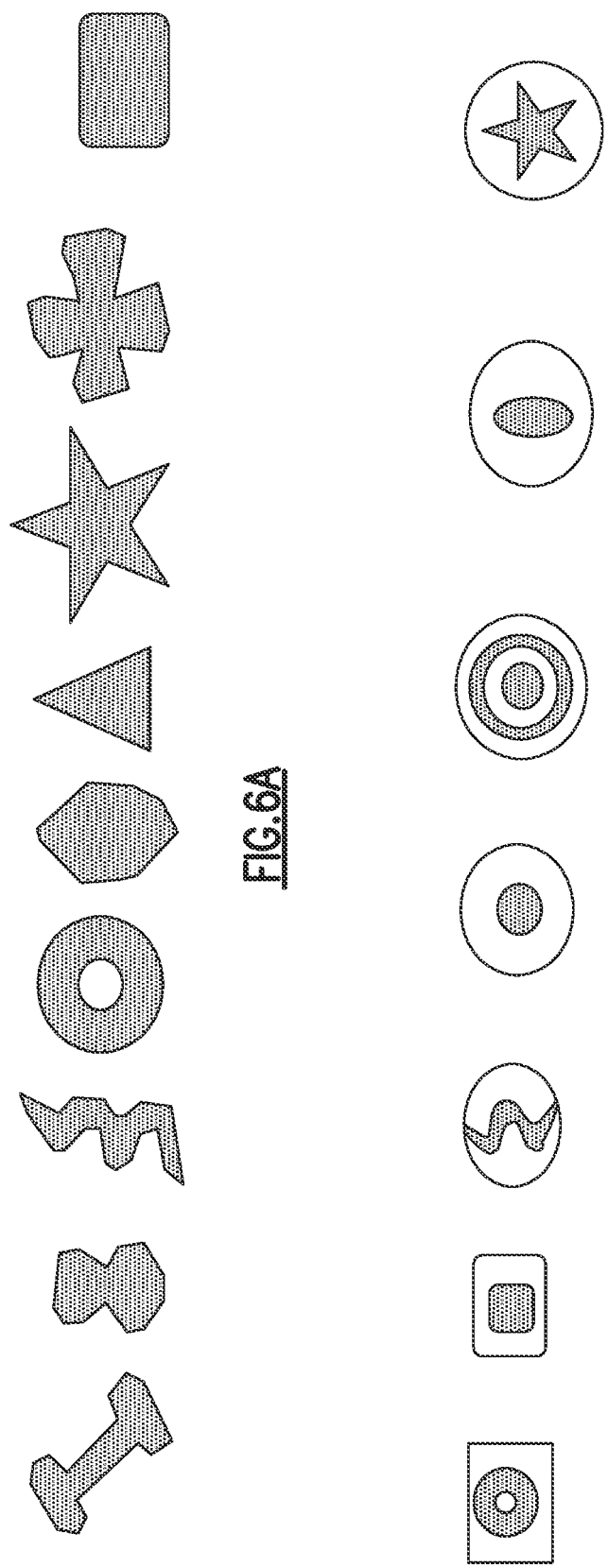

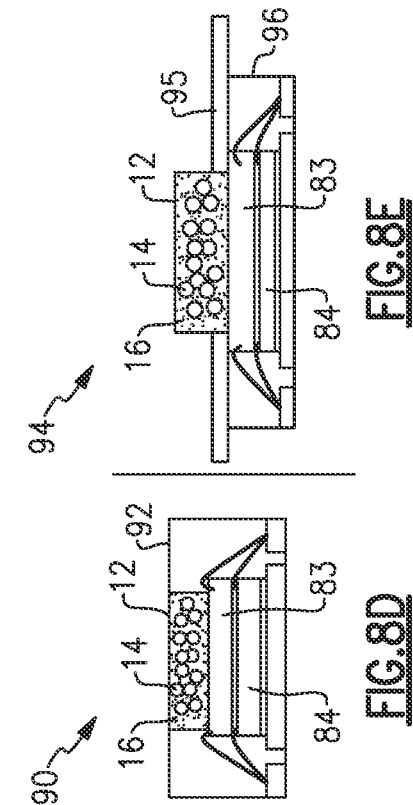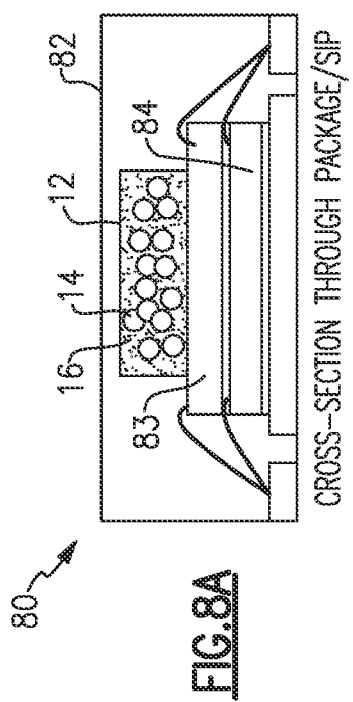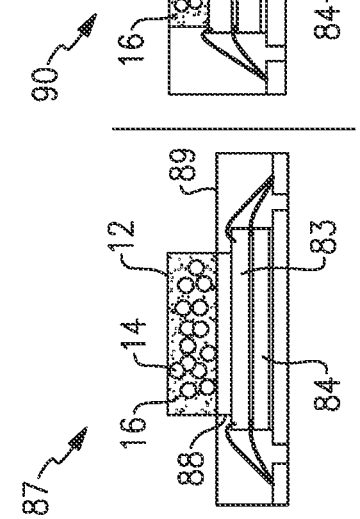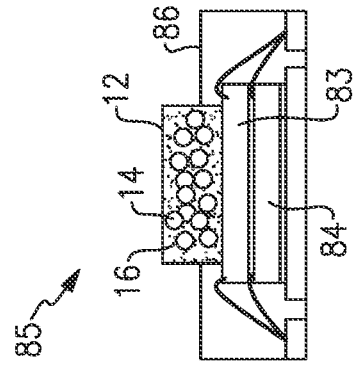

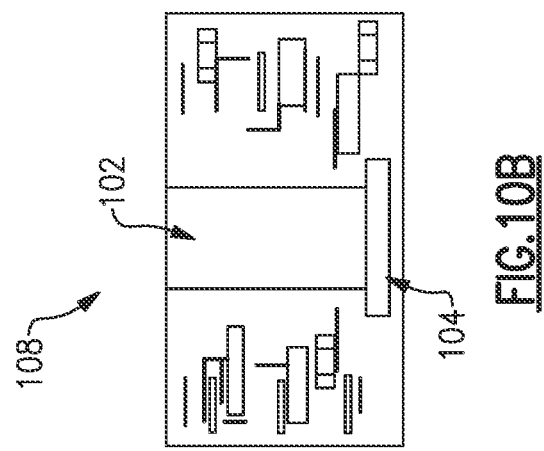
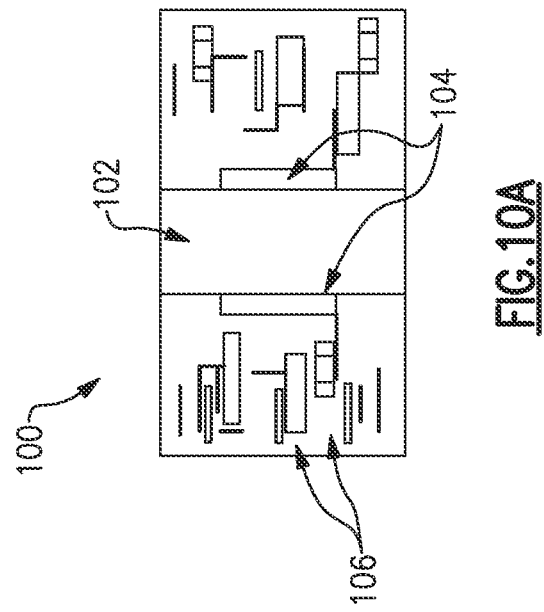

SIDE VIEW/CROSS-SECTION

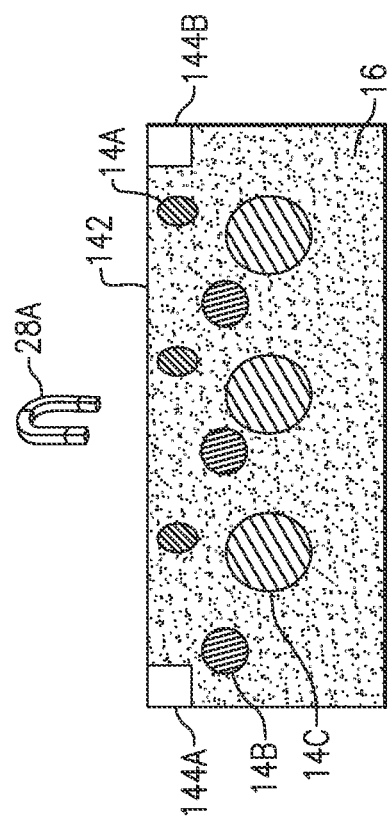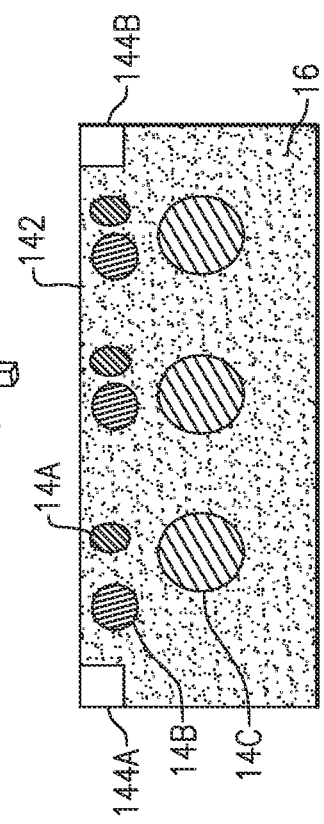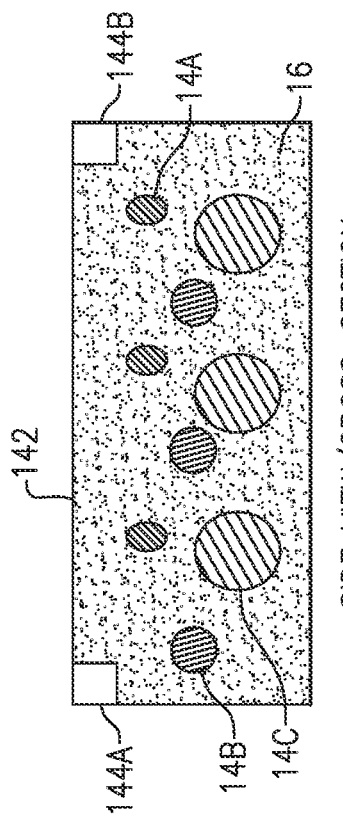

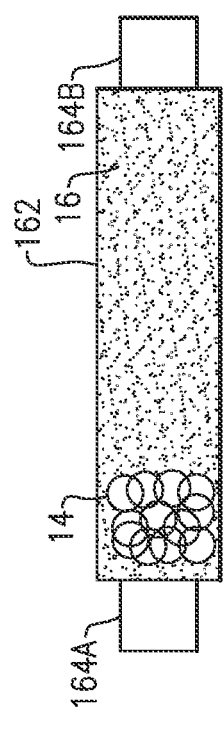
FIG.16A
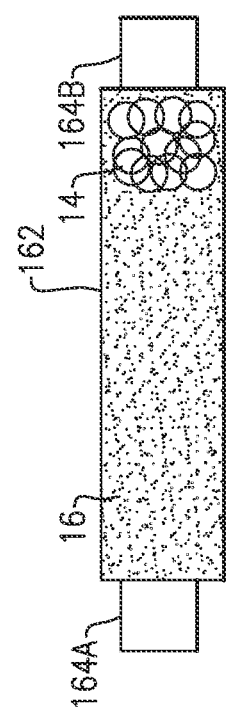
FIG.16B
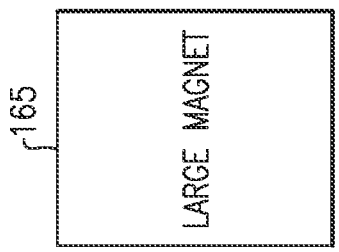

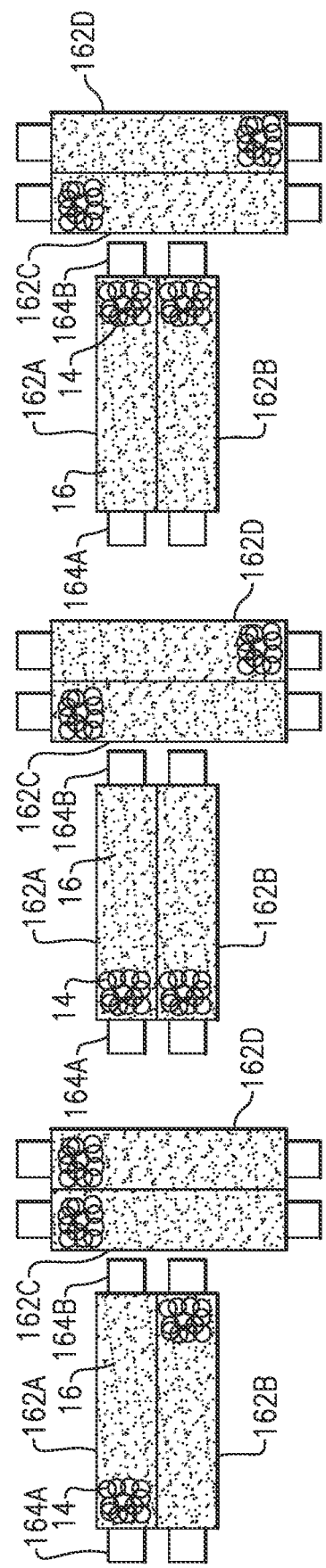

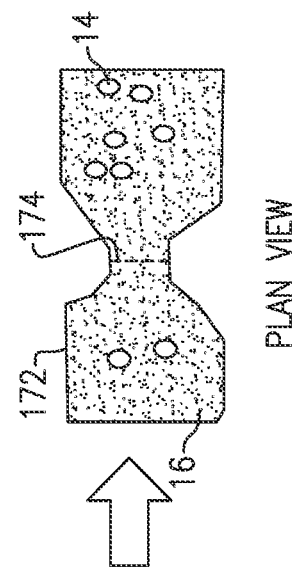
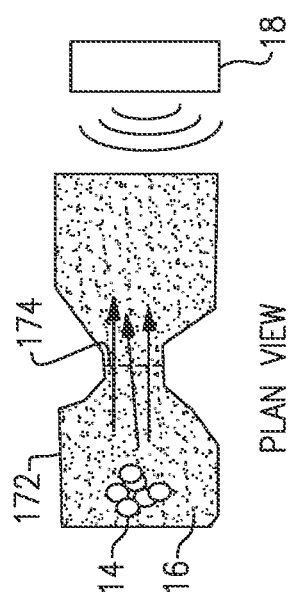

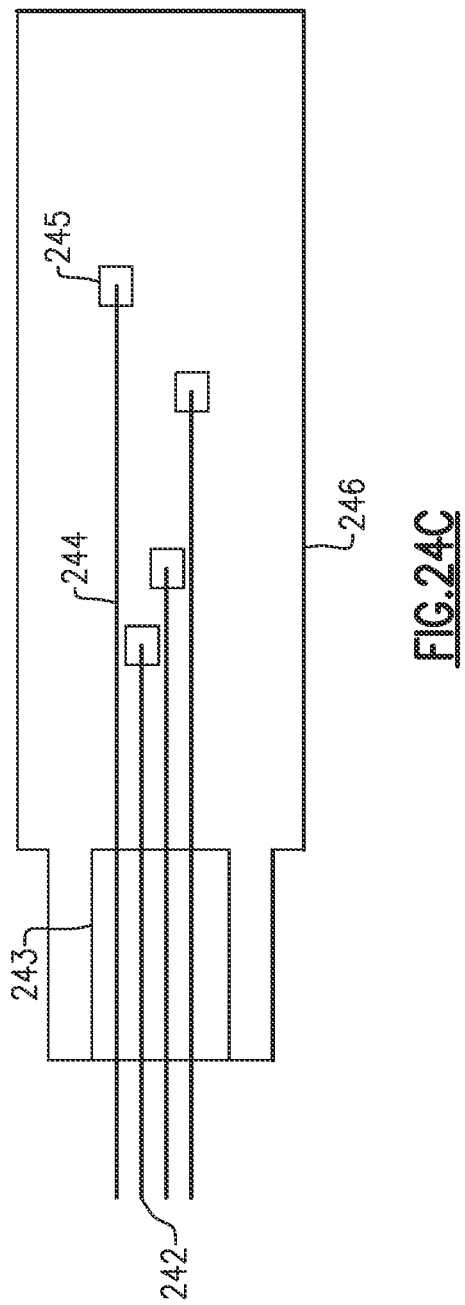

MAGNETIC FIELD SENSING BASED ON PARTICLE POSITION WITHIN CONTAINER

CROSS REFERENCE TO PRIORITY APPLICATION

Any and all applications for which a foreign or domestic priority claim is identified in the Application Data Sheet as filed with the present application are hereby incorporated by reference under 37 C.F.R. § 1.57. This application claims the benefit of priority of U.S. Provisional Application No. 63/261,614, filed Sep. 24, 2021 and titled "MAGNETIC FIELD SENSING BASED ON PARTICLE POSITIONS WITHIN CONTAINER," the disclosure of which is hereby incorporated by reference in its entirety and for all purposes.

BACKGROUND

Technical Field

The disclosed technology relates to magnetic field sensing.

Description of Related Technology

Magnetic fields can be detected in a variety of applications. Sensing magnetic fields can be used for a variety of purposes. Certain magnetic field sensors are manufactured with semiconductor fabrication processes and some can also be constructed by adding additional layers post wafer fabrication or by attaching or depositing or bonding additional structures or laminates/layers (incorporating magnetic materials) onto semiconductors. Such magnetic field sensors can be packaged with other semiconductor circuitry.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a system for magnetic field measurement. The system includes a container, at least one particle within the container, and a measurement circuit configured to output an indication of the magnetic field based on position of the at least one particle. The at least one particle moves within the container in response to a magnetic field. The measurement circuit includes circuitry of an integrated circuit. The integrated circuit is integrated with the container.

The at least one particle can include a magnetically sensitive particle within a fluid. The magnetically sensitive particle can be micrometer scale or larger. The magnetically sensitive particle can be millimeter scale or larger. Mobility of the magnetically sensitive particle in the fluid can be different above a defined temperature relative to below the defined temperature.

The at least one particle can be in a magnetically sensitive fluid.

The at least one particle can include a magnetically sensitive particle embedded in a film.

The container can be a sealed enclosure.

The system can include a sensor configured to provide an output signal to the measurement circuit. The sensor can be a magnetic sensor. The sensor can be a capacitive sensor. The sensor can include a microelectromechanical systems device.

The container can include a conductive case, and the measurement circuit can measure case conductance.

The measurement circuit can be included in an optical measurement system.

The integrated circuit can be vertically integrated with the container. The integrated circuit and the container can be on a common substrate and positioned laterally relative to each other.

The system can be a packaged module that includes a packaging structure. An opening in the packaging structure can leave at least a portion of the container exposed.

The system can include a magnetic structure integrated with the container. The magnetic structure can provide a bias.

The container can include a via extending between an inside of the container and outside of the container. The via can be conductive.

The container can include a conductive feature.

The container and the integrated circuit can be co packaged.

The system can include an antenna configured to wirelessly transmit information associated with the magnetic field.

The at least one particle can include a plurality of particles.

Another aspect of this disclosure is a system in a package (SIP) with magnetic field measurement. The SIP includes a container; at least one particle within the container, wherein the at least one particle moves within the container in response to a magnetic field; a measurement circuit configured to output an indication of the magnetic field based on position of the at least one particle; and a packaging structure enclosing the measurement circuit and including an opening, wherein at least a portion of the container is exposed by the opening.

The container can be stacked with an integrated circuit. The measurement circuit include circuitry of the integrated circuit.

The SIP can include a protective layer over at least part of the packaging structure.

The SIP can include one or more suitable features of the systems disclosed herein.

Another aspect of this disclosure is a system for magnetic field measurement. The system includes a container; at least one particle within the container, wherein the at least one particle moves within the container in response to a magnetic field; and means for measuring the magnetic field based on position of the at least one particle.

Another aspect of this disclosure is a method of magnetic field measurement. The method includes providing a container with particles therein, wherein the particles move in response to a magnetic field; and generating, with circuitry on an integrated circuit that is integrated with the container, a signal indicative of the magnetic field based on movement of the particles within the container.

The method can be performed using a system in accordance with any suitable principles and advantages disclosed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will be described, by way of non-limiting example, with reference to the accompanying drawings.

FIGS. 1A, 1B, and 1C are schematic side or cross-sectional views of a container that includes magnetically sensitive particles in a fluid according to an embodiment.

FIGS. 2A and 2B are schematic side or cross-sectional views of a container that includes non-magnetically sensitive particles in a ferromagnetic fluid according to an embodiment.

FIGS. 3A and 3B are schematic side or cross-sectional views of a container that includes a film with magnetically sensitive particles according to an embodiment in two different states.

FIGS. 4A, 4B, 4C, 4D, and 4E are schematic side or cross-sectional views of example containers with various cross-sectional shapes according to embodiments.

FIGS. 4F, 4G, and 4H illustrate schematic plan views of a container with a constricted region according to an embodiment.

FIG. 6A illustrates example shapes of magnetically sensitive particles.

FIG. 6B illustrates example combined structures with magnetically sensitive particles included within non-magnetic material.

FIGS. 8A, 8B, 8C, 8D, and 8E are schematic cross sections of systems in a package with a container that includes particles that move in response to an applied magnetic field according to embodiments.

FIGS. 10A and 10B schematically illustrate example integrated systems with enclosures containing magnetically sensitive particles according to embodiments

FIGS. 15A, 15B, and 15C are schematic side or cross-sectional views of a system for detecting magnetic field intensity with case conductance measurement according to an embodiment.

FIGS. 16A, 16B, 16C, 16D, 16E, and 16F are schematic side or cross-sectional views of enclosures with magnetically sensitive particles for zero-power magnetic field detection according to an embodiment.

FIGS. 17A and 17B are schematic side or cross-sectional views of a system configured for cumulative magnetic field exposure detection according to an embodiment.

FIG. 24C is a schematic view of a portion of the optical systems of FIGS. 24A and 24B.

DETAILED DESCRIPTION OF CERTAIN EMBODIMENTS

Figure 3C:
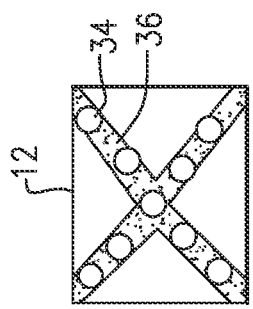
FIGS. 3C, 3D, 3E, and 3F schematically illustrate examples of a film with embedded magnetically sensitive particles within a container in plan view according to embodiments.
Figure 3E:
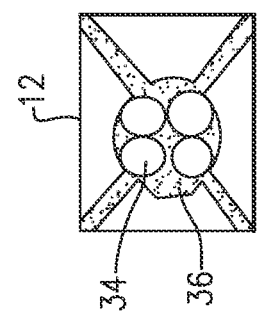
Figure 3D:
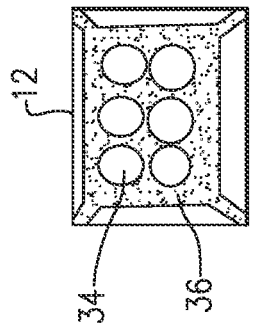
Figure 3F:
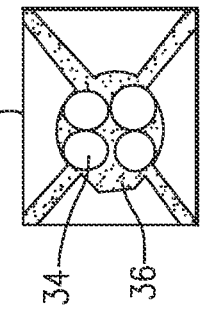

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawings and/or a subset of the illustrated elements. Further, some embodiments can incorporate any suitable combination of features from two or more drawings. The headings provided herein are for convenience only and do not necessarily affect the scope or meaning of the claims.

Aspects of this disclosure relate to detecting a magnetic field based on position and/or movement of at least one particle within a container. Particles can be included in a container that retains the particles. The particles move within the container in response to an applied magnetic field. The container can be a sealed enclosure. The particles can be magnetically sensitive particles in a fluid, magnetically sensitive particles embedded in a film, or particles (for example, non-magnetically sensitive particles) in a ferromagnetic fluid. Whether the particles themselves respond directly to the magnetic field, or whether they move because the fluid or film within which they are held responds directly to the magnetic field, the particles are capable of moving within the container in response to an applied magnetic field. A measurement circuit can measure the applied magnetic field based on position of the particles. A measurement circuit can measure the applied magnetic field based on movement of the particles. At least part of the measurement circuit can be included in an integrated circuit that is integrated with the container. The container and the measurement circuit can be included in a system in a package that includes a packaging structure enclosing the measurement circuit. The packaging structure can include an opening where at least a portion of the container is exposed by the opening. The magnetic field detection described herein has a variety of applications, such as detection of bodies with magnetic fields, biological sensing, and current sensing, among others.

In certain embodiments, particles in a sealed enclosure can move in response to an applied magnetic field. The applied magnetic field can be any magnetic field applied to an enclosure. In certain applications, the applied magnetic field is an external magnetic field applied to a magnetic field measurement system. A measurement circuit can detect the applied magnetic field based on positions or movement of the particles. Some or all of the circuitry of the measurement circuit can be included in an integrated circuit that is integrated with the enclosure. A sensor can sense the particles and provide an output signal to the measurement circuit in certain applications. A variety of different measurement techniques can be used to detect the particles, such as capacitive sensing, detecting an electrical short, magnetic sensing, optical sensing, microelectromechanical systems based sensing, or the like. In some instances, a relaxation process after switching off a magnetic field can be sensed. A frequency dependent response can be sensed in an alternating current field in some applications.

The particles can have properties that facilitate movement and/or interactions with one another (e.g., clustering behavior) in response to an applied magnetic field. Examples of such properties can include one or more of shape, material, size, density, weight, surface area, surface patterning, or the like. The particles can be suspended or embedded within a fluid, a gel, or a material that in combination the particles can respond in a desired way to a magnetic field.

The enclosure can include a conductive material in certain applications. The enclosure can include non-conductive materials in some applications. One or more magnetic structures can be integrated with the enclosure to modify and/or generate a magnetic field applied to the particles. A system can be configured such that the enclosure interacts with an external magnetic stimulus. The enclosure can contain conductive patterns and have areas within designed to detect the presence and/or clustering of magnetic or non-magnetic particles within the enclosure. The container can include one or more conductive vias from the internal surface to the external surfaces. Alternatively or additionally, the container can include one or more optical conduits and/or areas within the container that facilitate optical detection of particle clusters or movement of particles.

Embodiments disclosed herein can achieve advantages over other methods of magnetic field detection. For example, there can be advantages related to manufacturing. A container with particles can be manufactured separately from electronics, such as a measurement circuit, in a non-semiconductor process. As another example, parts of systems disclosed herein can be configured for magnetic field detection in environments that are not typically suitable for semiconductor components. Enclosing particles in a container of certain materials (for example, glass or ceramic) can enable at least part of the system to be exposed to a harsher environment than standard packaged semiconductor circuitry.

An advantage of embodiments disclosed herein is that omnidirectional magnetic field detectors can be implemented efficiently in accordance with principles and advantages disclosed herein. By contrast, most magnetic field detectors measure magnetic fields in a given direction, such that in order to detect fields in multiple directions, sensing structures are replicated at greater cost, space occupancy and complexity.

Another advantage of embodiments disclosed herein is ease of modifying the sensitivity and/or range of magnetic field detection by changing one or more features of the particles (e.g., nature, size, or number of particles), one or more features of the fluid in which the particles are immersed, or one or more features of the enclosure (e.g., by adding one or more shields or thinning the enclosure). Also, it is relatively easy to adjust the sensitivity curve. This can allow magnetic field detection that can be made particularly sensitive to a certain range of field intensities, allowing for sensitivity to lower intensity fields and avoiding saturation in more intense fields, as desired.

Structures disclosed herein can also facilitate detection without power. Particles can cluster in a container in response to a magnetic field. The particles can move and adopt positions in response to external fields while no power is applied to the detector. Power can be subsequently applied for interrogation, such as detecting and measuring positions or change in positions of particles or clusters of the particles. The detected positions can reflect cumulative and/or time related exposure to a magnetic field. Such detectors can be passive systems attached as a label to an element to track exposure to magnetic fields over time. A measurement circuit can read out a maximum field intensity that the device has been exposed to or another magnetic field measurement. Resetting magnetic field detectors can be relatively easy.

Certain geometries can be created in accordance with principles and advantages disclosed herein that are sensitive to certain patterns in a magnetic field. For example, if there is a rotational field, whether the rotation changes its characteristics can be detected. As another example, a type of security lock can be implemented where applying a certain pattern of a dynamic magnetic field can open a lock.

Optical detectors and/or emitters can be used instead of a magnetic field sensor to sense the movement, shape and/or position of the particles. Optical detection can result in a faster response time in certain applications.

A reed switch type detector can be implemented. The reed switch detector can generate a contact when a magnetic field is applied and open when the magnetic field falls under a certain limit. A contact can be generated that is still closed (or still open) after applying the field. This can involve two electrodes in a container and particles closing the contact.

Magnetically Sensitive Particles in Fluid

Embodiments disclosed herein relate to a container with magnetically sensitive particles in a fluid. The magnetically sensitive particles can be retained within the container. The container can be a sealed enclosure. The magnetically sensitive particles and possibly the fluid also can be selected such that the magnetically sensitive particles can move within the container in response to exposure to an applied magnetic field in a detectable manner. The fluid can be a liquid or a gel having a viscosity suitable to facilitate movement of the magnetically sensitive particles within the container such that the movement of the particles can be detected. The fluid can have a suitable density and viscosity based on a desired range of measurement for a particular application. The fluid can have a dilation constant that is relatively small such that there are no significant technical challenges with forcing the enclosure when temperature drifts. Example fluids include without limitation aqueous solutions (e.g., buffers, aqueous electrolytes, aqueous solutions with conductive salts, aqueous solutions without conductive salts, pH buffers, salts in water, etc.), organic solutions (e.g., oils or organic solvents), aqueous or organic gels (e.g., a hydrogel, PVC, polyacrylic acid, a polyvinyl-alcohol gel, a polydimethylsiloxane gel, agarose-PBS, a PVC gel in organic solvents such as 2-nitrophenyl octyl ether, etc.), a wax, a conductive polymer (e.g., PEDOT, Nafion dispersions, etc.), water, an alcohol, an oil, or a fluid that allows Brownian motion of magnetically sensitive particles within the fluid. Positions of the magnetically sensitive particles can be detected optically, with capacitive sensing, by determining an electrical short, with magnetic sensing, or the like.

FIGS. 1A, 1B, and 1C illustrate a container 12 that includes magnetically sensitive particles 14 in a fluid 16 according to an embodiment. The container 12 can be a sealed enclosure. The magnetically sensitive particles 14 can include any suitable combination of features of the magnetically sensitive particles disclosed herein. The magnetically sensitive particles 14 can include one or more of the following materials: iron, cobalt, nickel, graphite, chromium, or any suitable alloy thereof. The magnetically sensitive particles 14 can include one or more of the following materials: Heusler alloys or chromium oxide. In certain applications, magnetically sensitive particles 14 can include polystyrene (PS) magnetic particles. Polystyrene magnetic particles can be synthesized by embedding superparamagnetic iron oxide into polystyrene. Polystyrene magnetic particles can be positively charged (e.g., by amine modification), unmodified, or negatively changed (e.g., by carboxyl modification). In some applications, magnetically sensitive particles can include streptavidin coated magnetic particles. FIG. 1A illustrates a position of the magnetically sensitive particles 14 when no external magnetic field is being applied.

A magnetic field source 18 can apply a magnetic field to move the magnetically sensitive particles 14 within the fluid 16. In some instances, the magnetic field source 18 can be a magnetic body. The magnetic field source 18 can include alternating poles. This can enhance attraction of magnetically sensitive particles 14 in certain applications. The applied magnetic field can be a gradient magnetic field to move the magnetically sensitive particles 14. A homogenous magnetic field can cause the magnetically sensitive particles 14 to attract each other and cluster. In some instances, clustering of the magnetically sensitive particles 14 can be detected.

FIG. 1B illustrates that a magnetic field can move the magnetically sensitive particles 14 to a side of the container 12. FIG. 1C illustrates that a different magnetic field can move the magnetically sensitive particles 14 in a different direction. In FIGS. 1A, 1B, and 1C, the magnetically sensitive particles 14 are attracted to the applied magnetic field. The magnetically sensitive particles 14 can be paramagnetic, for example. Paramagnetic materials include metals that are weakly attracted to magnets. Examples of paramagnetic materials include lithium, aluminium, tungsten, platinum, and manganese salts. The magnetically sensitive particles 14 can be ferromagnetic. Such magnetically sensitive particles 14 can include one or more suitable ferromagnetic material, such as iron, nickel, or cobalt. In some other applications, the magnetically sensitive particles 14 can be diamagnetic and be repelled from the applied magnetic field. Examples of diamagnetic materials include graphite, gold, bismuth, antimony, quartz, and silver. Based on the positions of the magnetically sensitive particles 14 in FIG. 1B or FIG. 1C, a measurement circuit can generate an indication of an applied magnetic field. This can measure the magnetic field based on positions of the magnetically sensitive particles 14 within the container 12.

Non-Magnetically Sensitive Particles in Magnetically Sensitive Fluid

In some embodiments, a container can include non-magnetically sensitive particles in a magnetically sensitive fluid. The magnetically sensitive fluid can be a ferromagnetic fluid, a paramagnetic fluid, a diamagnetic fluid, or a magnetorheological fluid. The magnetically sensitive fluid can change density based on the characteristics of an external magnetic field and the particles can then change the depth where they are located within the fluid. The magnetically sensitive fluid can be a magnetorheological fluid that changes mechanical viscosity significantly when exposed to magnetic field. Such a fluid can reduce and/or prevent particle movement when magnetized and allow particle movement in the absence of a magnetic field.

Examples of magnetically sensitive fluids include ferrofluids made with particles of magnetic materials such as magnetite, maghemite or cobalt ferrite dispersed in a fluid, such as water or an organic solvent. The properties of the ferrofluid and density of the particles may be chosen for the specifications of a particular application.

The magnetically sensitive fluid can be liquid. A plurality of different types of non-magnetic particles can be included in the magnetically sensitive fluid. Positions of the different types of non-magnetic particles can be used to measure an applied magnetic field. With magnetic density separation, an indication of an applied magnetic field can be determined based on positions of the non-magnetically sensitive particles. While the particles need not be directly responsive to external magnetic fields, advantageously the particles can be chosen to facilitate sensing their positions when they are moved by the fluid's response to external magnetic fields. Example materials include non-magnetic conductors (e.g., aluminium, charged particles such as particles with carboxylate or amino groups on the surface making them conductive but not magnetic, etc.), a plastic, foam, polyethylene terephthalate (PET), and silica particles. In certain applications, non-magnetic particles can be non-magnetic polystyrene particles. Non-magnetic polystyrene particles can be positively charged (e.g., by amine modification), unmodified, or negatively charged (e.g., by carboxyl modification). In some applications, non-magnetic particles can include streptavidin coated non-magnetic particles. Non-magnetic particles can be selected based on how they are to be detected in the system. For example, with optical detection, opaque non-magnetic particles can be used. The non-magnetic particles can be mechanically resilient. Any suitable principles and advantages of the embodiments described with reference to magnetically sensitive particles can be applied to non-magnetically sensitive particles within a magnetic fluid.

FIGS. 2A and 2B illustrate a container 12 that includes non-magnetically sensitive particles 24A, 24B, and 24C in a ferromagnetic fluid 26 according to an embodiment. The container 12 can be a sealed enclosure. The non-magnetically sensitive particles 24A, 24B, and 24C include a plurality of different types of particles different properties, such as shape, density, or weight. As illustrated, there are three different types of non-magnetically sensitive particles 24A, 24B, and 24C in the ferromagnetic fluid 26. The different types of non-magnetically sensitive particles 24A, 24B, and 24C can have the same or similar sizes and different densities. The non-magnetically sensitive particles 24A, 24B, and 24C can be electrically conductive in certain applications.

FIG. 2A shows an initial position of non-magnetically sensitive particles 24A, 24B, and 24C. A magnetic field source 28 can apply a magnetic field that causes the non-magnetically sensitive particles 24A, 24B, and 24C to move in the ferromagnetic fluid 26. A gradient in the magnetic field can cause density of the ferromagnetic fluid 26 to change, which can in turn cause the non-magnetically sensitive particles 24A, 24B, and/or 24C to move within the ferromagnetic fluid 26. The magnetic field applied by the magnetic field source 28 can cause the non-magnetically sensitive particles 24A, 24B, and 24C to move to the positions shown in FIG. 2B. A measurement circuit can detect the positions of at least some of the non-magnetically sensitive particles 24A, 24B, and/or 24C to generate an indication of the applied magnetic field. This can measure the magnetic field based on positions of at least some of the non-magnetically sensitive particles 24A, 24B, and 24C within the container 12.

In the embodiment of FIGS. 2A and 2B, the magnetic field does not directly attract non-magnetically sensitive particles. The magnetic field changes the density of the ferromagnetic fluid 26 depending on the field intensity and variation so the non-magnetically sensitive particles 24A, 24B, and 24C will move to a different level in the magnetically sensitive fluid 26.

Magnetically sensitive particles can also or alternatively be included in magnetically sensitive fluid in an embodiment. For example, diamagnetic particles can be included in a ferromagnetic fluid. Strong diamagnetic material, such as graphite, tends to generate a repelling force in a magnetic field.

Layer of Material with Magnetically Sensitive Particles

In some embodiments, magnetically sensitive particles can be embedded in and/or deposited on a layer of material. The layer of material can be within a container. The container can be a sealed enclosure. The layer of material can be a film, a sheet of material, a flexible layer, or the like. For example, the layer of material can be a film with the magnetically sensitive materials embedded therein or a magnetic film or layer incorporated in a flexible laminate structure. As another example, the layer of material can be sheet of material or a flexible layer with magnetic material deposited or adhered thereon. The magnetically sensitive particles can be implemented in accordance with any suitable principles and advantages disclosed herein.

The layer of material can be suspended within the container with or without surrounding fluid. In one example, the layer is suspended in air or an inert gas. In another example, the layer is suspended in a liquid with a viscosity selected to tune the film's sensitivity (degree of movement in response) to external magnetic fields, similar to those described above for the magnetically sensitive particle embodiments. The layer of material can be tethered to the container. The layer of material can be tethered to the inside of the container and arranged such that the layer of material can deflect in response to a magnetic field. In certain applications, the layer of material can return to an initial position when no magnetic field is applied due, for example, to elasticity in the material of the layer.

The layer of material can be flexible substrate. Suitable materials for the layer include polymer materials such as SU-8, polyimide, polyvinyl alcohol, polyacrylic acid, polyvinylalcohol, polydimethylsiloxane, poly(3,4-ethylenedioxythiophene), Nafion, polyaniline, or the like. Some such polymer materials are conductive. In some instances, the layer can include a plastic such as polyethylene terephthalate (PET), polyethylene naphthalate (PEN), polyimide, or a transparent plastic. According to some applications, the layer can include a ferroelectric thin film. The layer can include thin glass. The layer can include a metal foil. The layer can have metal traces formed thereon and/or particles attached/embedded. The layer can alternatively or additionally include metallic non-magnetic material such as Au, Cu, or Al. The layer can include magnetic materials such as NiFe, Ni, NiFeCo, CoZrTa, CoFe, or the like. The layer can include gold in certain instances. In some instances, the layer can be a mesh rather than a continuous layer. Any suitable principles and advantages of the embodiments described with reference to magnetically sensitive particles can be applied to layers of material with magnetically sensitive particles.

FIGS. 3A and 3B illustrate side views of a container 12 that includes a film 36 with magnetically sensitive particles 34 in two different states according to an embodiment. The film 36 includes the magnetically sensitive particles 34 embedded therein. The magnetically sensitive particles 34 can be diamagnetic, paramagnetic, ferromagnetic, or ferrimagnetic. For example, the magnetically sensitive particles 34 are diamagnetic in an embodiment. As another example, the magnetically sensitive particles 34 are paramagnetic as shown in FIG. 3B. As another example, the magnetically sensitive particles 34 can include a ferromagnetic material, such as iron, nickel, or cobalt. As one more example, the magnetically sensitive particles 34 can include ferromagnetic material, such as magnetite ($Fe_3O_4$). The film 36 can deflect and/or displace relative to a central axis in response to an applied magnetic field. Movement of the film 36 can produce a discernible electrical output, such as a capacitance. For example, as the film 36 moves, capacitors formed by the film 36 and the top and bottom of the container 12 can change. In this example, both capacitors are related in order to compensate for several effects (e.g., temperature). In some instances, the film 36 can include an electroactive polymer. In other examples, the particles can be non-magnetically sensitive and chosen for position detectability, and the film material can be magnetically sensitive. For example, such a magnetically sensitive material can include Ni, NiFe, CoFe, CoZrTa, Co, or the like. In certain applications, a magnetically sensitive layer without embedded non-magnetically sensitive particles can be implemented.

In FIG. 3A, no magnetic field is being applied and the film 36 is in an initial position. A magnetic field source 38 with magnetic properties applying a magnetic field causes the film 36 to move to the position shown in FIG. 3B. As shown in FIG. 3B, the film 36 can deflect toward the magnetic field source 38 in certain applications. A measurement circuit can detect the movement and/or position of the film 36 to generate an indication of the applied magnetic field. This can measure the magnetic field based on positions of the magnetically sensitive particles 34 within the container 12.

FIGS. 3C, 3D, 3E, and 3F illustrate examples of films 36 with embedded magnetically sensitive particles 34 within a container 12 in plan view according to embodiments. The film 36 can have any suitable shape for a particular application. The magnetically sensitive particles 34 have any suitable pattern and/or arrangement within the film 36. In the illustrated examples, relatively elastic tethers facilitate deformation of the film 36 and attendant changes in position of the particles 34 in response to an external or applied magnetic field.

Containers

In certain embodiments, the container is a sealed enclosure made from glass. This can enable the enclosure to be sealed similar to the technologies applied for assembling hermetically sealed semiconductor packaging. According to some embodiments, the container can be flexible, include a laminate, a ceramic, glass, or a metal. The container can include several different layers.

In certain applications, a hermetically sealed enclosure can be fabricated in a non-semiconductor/wafer fabrication environment. Some or all of such an enclosure can be exposed in a harsh environment. Examples of harsh environments include without limitation acidic environments, corrosive environments, and high temperature environments. Fabricating the enclosure and including particles for detecting a magnetic field within the enclosure can be carried out in a separate manufacturing location and/or process from the manufacturing location of an integrated circuit that is integrated with the enclosure. At a later stage of manufacturing, such as a packaging stage, the enclosure can be integrated with the integrated circuit. For example, the enclosure can be incorporated within a module or stacked with an integrated circuit that includes semiconductors and/or supporting circuitry and systems.

Containers for particles can have any suitable shape and size for a particular application. Enclosures containing particles for magnetic field detection can be shaped to enhance and/or optimize sensing of magnetic fields and/or magnetic bodies. FIGS. 4A, 4B, 4C, 4D, and 4E illustrate example containers 42A, 42B, 42C, 42D, and 42E, respectively, with various cross-sectional shapes. Different fluid enclosure shapes can enable proximity of magnetic bodies and/or fields to be adjusted for particular applications.

An enclosure can be shaped for desired particle movement paths/speeds/distance in the presence of an applied magnetic field. For example, FIGS. 4F, 4G, and 4H illustrate a plan view of a container 42F with a constricted region. Over time and/or with a minimal threshold field, particles can flow through the constricted region based on exposure to an applied magnetic field. For instance, in FIGS. 4G and 4H, magnetically sensitive particles 14 flow toward a magnetic field source 48 that has an associated magnetic field. A biasing structure 45 integrated with the container 42F can bring the magnetically sensitive particles 42 to an initial position. The magnetically sensitive particles 14 are in the initial position in FIG. 4F. The biasing structure 45 can be deactivated to allow the magnetically sensitive particles 14 to flow in response to an applied magnetic field. The biasing structure 45 can also be used as a reset mechanism to bring the magnetically sensitive particles 14 to the initial position. The container 42F and magnetically sensitive particles 14 can be used to detect a cumulative magnetic field exposure based on an amount of magnetically sensitive particles 14 that move through the constricted region.

In some instances, a semipermeable membrane can be included in a narrow side of the container 42F so that the magnetically sensitive particles 14 find little resistance crossing towards one direction but not the opposite direction. That can allow magnetically sensitive particles 14 to move to one side and remain there even when the magnetic field is no longer present. If such a membrane is designed accordingly, the magnetically sensitive particles 14 can be impeded from moving back through the membrane, or moved through the membrane by applying a strong magnetic and/or electric field to reset the device.

Figure 5:
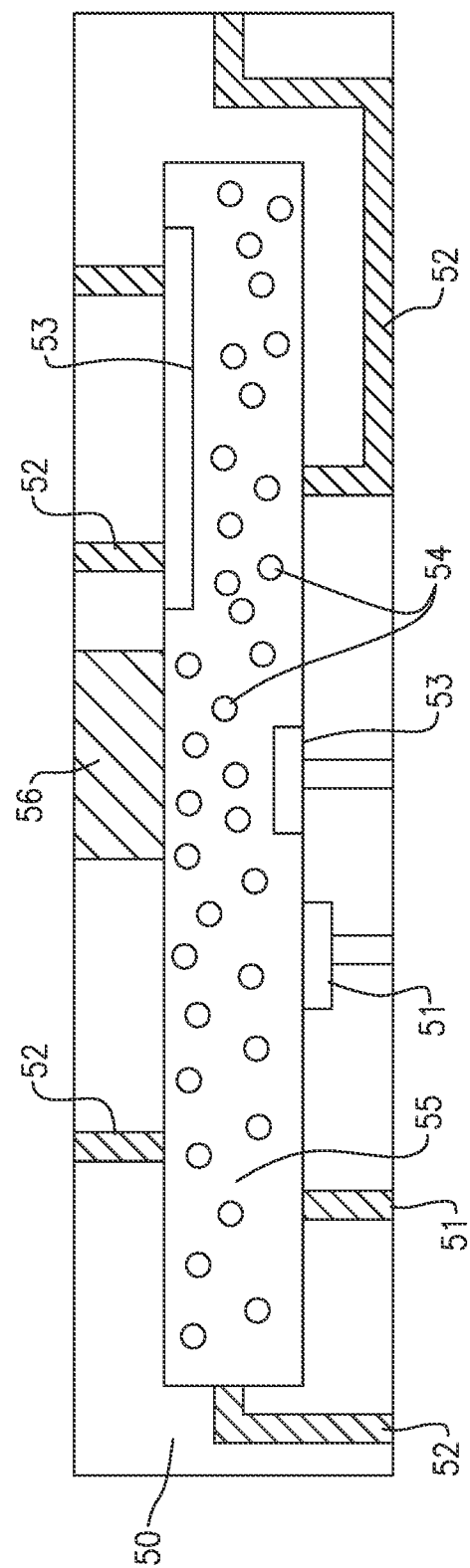
FIG. 5 is a schematic cross-sectional view of an example enclosure having a plurality of integrated structures according to an embodiment.

A container can include one or more integrated structures. FIG. 5 illustrates an example enclosure 50 having a plurality of integrated structures according to an embodiment. One of more of these structures can be integrated with any of the containers disclosed herein as suitable. As illustrated, the enclosure 50 includes conductive structures 51 and 52. The illustrated conductive structures 51 include vias and a conductive trace through or on packaging dielectric materials (e.g., printed circuit board (PCB) layers, encapsulating molding materials, etc.). The enclosure 50 can include one or more structures 53 on a surface thereof (and/or embedded within the layers of the enclosure 50). For example, a sensor, a conductive trace, or a coil can be included on an inner surface (as shown) or outer surface of the enclosure 50. The enclosure 50 can include electrically conductive paths 52 from an internal part of the enclosure 50 to external to the enclosure 50, which can also be provided in the form of traces, vias and/or lead frame materials. The enclosure 50 also includes particles 54 within a material 55. The particles 54 can be one or more of conductive, magnetically sensitive, paramagnetic, ferromagnetic, or ferrimagnetic materials. The material 55 can be a fluid, a liquid, a gel, a paste, a foam, or a polymer that permits relative movement of the particles in response to magnetic fields. The material 55 can be electroactive. The enclosure 50 can include an optical window 56 such that a cluster or movement of particles can be optically detected.

Magnetically Sensitive Particles

Magnetically sensitive particles can have one or more properties such that the magnetically sensitive particles move in a desired way to the magnetic stimulus. For example, magnetically sensitive particles can be constructed, shaped, patterned, or the like so the magnetically sensitive particles respond to a magnetic stimulus in a desired way. As one example, a spiral shaped magnetic particle can respond to a magnetically induced force and move through fluid differently than a spherical or square shaped particle. The viscosity of the fluid and the shape of the magnetically sensitive particle can be balanced for movement of the magnetic particle in response to an applied magnetic field. The magnetically sensitive particles can be coated with an electrically conductive material (e.g., gold) such that when a certain amount of particles cluster or align, a conductive path is formed between electrical contacts in a container. The magnetically sensitive particles can be coated with a coating to enhance optical detection, such as a coating to achieve one or more of a desired optical contrast, color, fluorescence, luminescence, or another optical property. In certain instances, magnetically sensitive particles can incorporate a functional coating so as to be chemically inert or to chemically react with a surface or other structure depending on the specifications of the particular application.

In some instances, one or more internal sections of an enclosure can be patterned with magnetic material to detect clusters of particles in specific regions. The shape of magnetically sensitive particles can affect how the magnetically sensitive particles move and cluster in such applications. Depending on the outermost material, magnetically sensitive particles may stick together. In some applications, the magnetically sensitive particles can be coated with a thin material, such as Teflon or another polymer, so that there is little or no potential for the magnetically sensitive particles to stick together and/or cluster for any reason other than a response to a magnetic field. The enclosure can incorporate one or more conductive vias and connections from the internal surfaces to the external. The enclosure can incorporate one or more optical conduits and/or areas that facilitate optical detection of particle clusters or movement.

Magnetically sensitive particles can be constructed to move and/or respond in different ways. Sensitivity, such as movement, to certain field strengths can be improved with certain particle constructions, shapes, etc. The magnetically sensitive particles can be combined with and/or embedded within non-magnetic material to provide the effect of a partially patterned structure. The combined structure can then be inserted within a fluid, a gel, or a film.

In some instances, magnetically sensitive particles can include an outer coating that is magnetically sensitive. As an example, magnetically sensitive particles can be a polystyrene bead coated with nickel or another magnetically sensitive material. Such magnetically sensitive particles can have an overall density of magnetic material that is lower than a homogenous sphere of magnetically sensitive material. In some other examples, magnetically sensitive particles can have magnetically sensitive core materials and coatings selected to enhance or inhibit interaction with each other and/or the surrounding fluid. For example, the outer coating could be polystyrene, PTFE, Teflon, or some other polymer that can inhibit particles sticking together other than in a desired way as a response to stimulus from a magnetic field.

In certain instances, magnetically sensitive particles have an electrically conductive outer surface. For example, magnetically sensitive particles can be coated with gold. With such magnetically sensitive particles, an electric contact between two electrodes in the container can be closed.

Magnetically sensitive particles can have a coating with one or more specific optical properties in some applications. With such a coating, one or more of a contrast, a color, luminescence or fluorescence can be achieved. The coating with one or more specific optical properties can aid optical detection of magnetically sensitive particles.

Magnetically sensitive particles can be ferromagnetic, ferrimagnetic, paramagnetic, or diamagnetic. Diamagnetic particles are repelled by a magnetic field. In contrast, paramagnetic and ferromagnetic particles are attracted by a magnetic field.

The magnetically sensitive particles can have any suitable size for a particular application. In certain applications, magnetically sensitive particles are micrometer scale or larger. In some applications, magnetically sensitive particles are millimeter-scale particles. Magnetically sensitive particles can be larger than millimeter-scale. In certain applications, magnetically sensitive particles can have a particle width in a range from about 50 nanometers to 1 millimeter. In some such applications, particle width can be in a range from about 0.1 micron to 100 microns. In some of these applications, particle width can be in a range from about 0.5 micron to 100 microns.

Magnetically sensitive particles can have a shape to influence their movement and/or orientation in the fluid such that their sensitivity to the magnetic field stimulus is enhanced and/or optimized. In certain applications, it may be desirable to have a non-symmetrical magnetically sensitive particle so that the magnetically sensitive particle moves in a particular way when exposed to a magnetic field. A combination of the shape of the magnetically sensitive particle and how the magnetically sensitive particle is embedded or suspended in a fluid/gel can be receptive to magnetic stimuli in particular directions and/or intensities. A particular particle shape combined with a fluid or gel of a particular viscosity can provide a desired sensitivity to a magnetic stimulus. Different particle sizes and shapes can be combined as desired for a range of target sensitivities within a system.

FIG. 6A illustrates example shapes of magnetically sensitive particles. The magnetically sensitive particles can be added to an inert, non-magnetic material to form a combined structure. FIG. 6B illustrates example combined structures with magnetically sensitive particles included within non-magnetic material. Various processes, such as molding, printing, laser cutting, laminating, and the like, can be used to fabricate composite particles incorporating magnetically sensitive particles so that the magnetically sensitive particles react in a desired manner to a magnetic field. For example, with an outer non-magnetic layer, when a number of the composite particles come together they may be held in a cluster by a magnetic field/force. Such composite particles can have non-magnetic material come into physical contact with one or more other composite particles. Such a construction can be desirable to allow release of such composite particles from one another in the absence of the magnetic field. For example, spherical particles with magnetic cores and covered with polystyrene/PTFE may be less likely to stick together and may bounce off each other. A combination of particle shape (e.g., spiral shape, propeller shape, etc.) and fluid viscosity can determine sensitivity and/or speed of a response to a magnetic field stimulus.

Figure 6C:
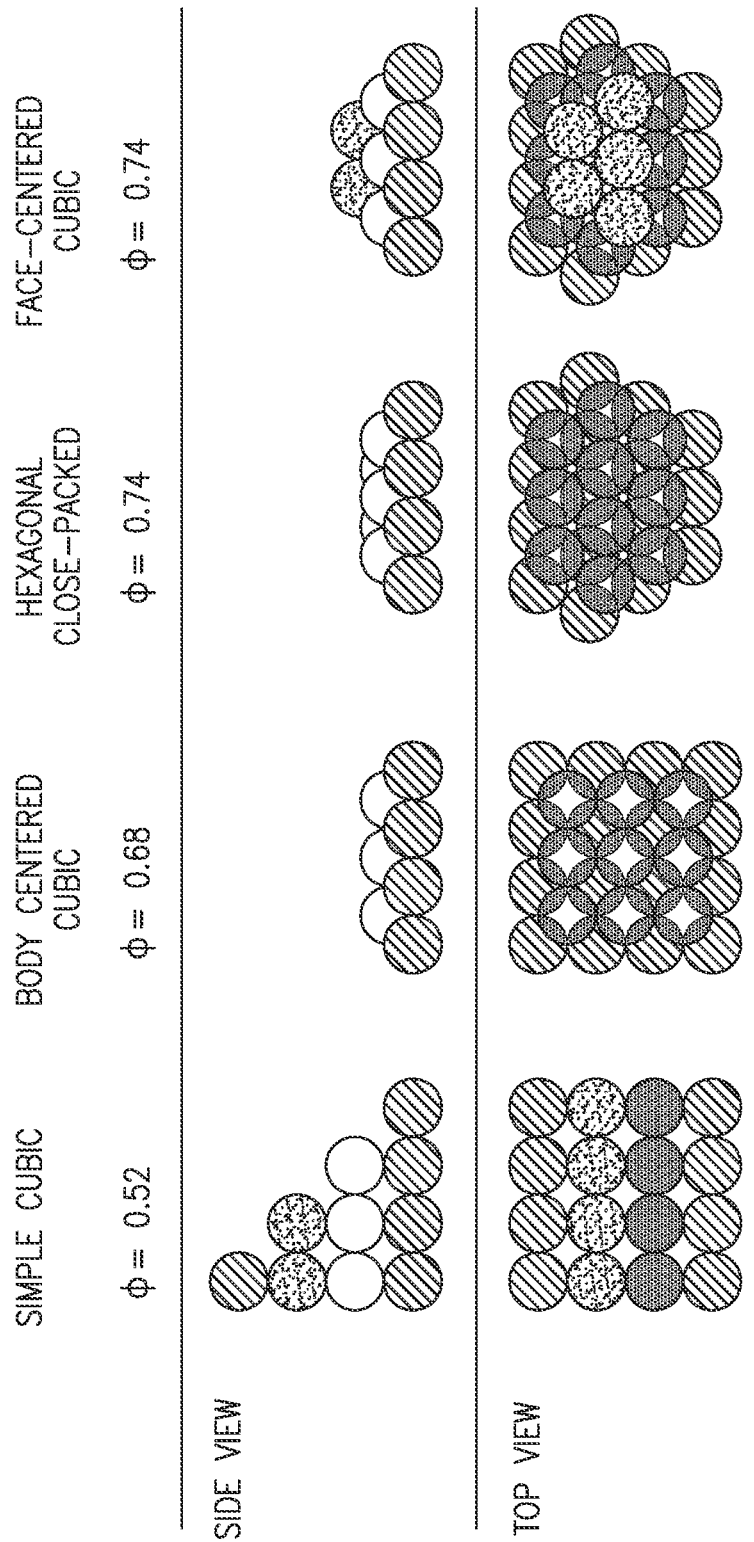
FIG. 6C shows examples of clusters of particles.

Magnetically sensitive particles can have various sizes and densities. If all particles are the same size, a contact surface area can be relatively small. By using a plurality of sizes (e.g., large and small), a bridging structure can have more contact points. This can allow smaller particles to reduce resistance/increase current carrying capability. FIG. 6C shows examples of how combining different types of particles can result in clustering with different shapes, which can be useful for detection purposes.

Container with Integrated Circuit

Magnetic field measurement systems can include a container, one or more particles within the container, and a measurement circuit configured to output an indication of an applied magnetic field based on position(s) of at least one particle within the container. The container can be integrated with, for example co-packaged with, an integrated circuit. The container can include an electrical connection to the integrated circuit. The integrated circuit can include some or all of the measurement circuit. In some instances, the integrated circuit can also include a sensor that senses position(s) of particles within the container. The sensor can output a signal to the measurement circuit. In some other applications, the measurement circuit can generate a measurement of the applied magnetic field without a separate sensor.

FIGS. 7 to 12 illustrate systems and modules that include a container integrated with an integrated circuit that includes a measurement circuit. Any suitable principles and advantages of these embodiments can be implemented together with each other. Moreover, the embodiments of FIGS. 7 to 12 can be implemented with any other suitable principles and advantages disclosed herein related to containers, particles, and magnetic field measurements disclosed here can be implemented together with any of the embodiments of FIGS. 7 to 12.

Figure 7:
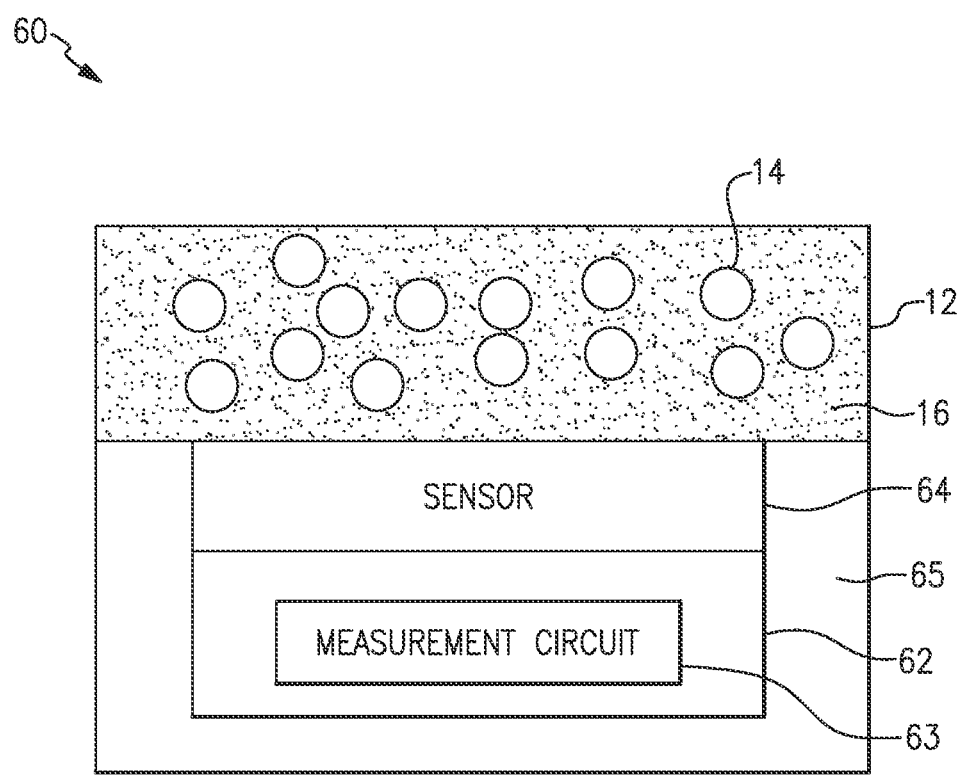
FIG. 7 is a schematic block diagram of a magnetic field sensing system according to an embodiment.

FIG. 7 is a schematic block diagram of a magnetic field sensing system 60 according to an embodiment. In the magnetic field sensing system 60, a magnetic field measurement is generated based on positions of particles within a container. The magnetic field sensing system 60 includes a container 12 enclosing fluid 16 and magnetically sensitive particles 14 suspended within the fluid 16. An integrated circuit 62 is integrated with the container 12. As illustrated, the integrated circuit 62 is vertically integrated with the container 12. The integrated circuit 62 includes a measurement circuit 63. A sensor 64 is also integrated with the container 12. A packaging structure 65 can protect the integrated circuit 62 and the sensor 64. The container 12, the sensor 64, and the integrated circuit 62 can be co-packaged.

The sensor 64 can sense position of the magnetically sensitive particles 14. The sensor 64 can be a magnetic sensor, a capacitive sensor, a MEMS based sensor, an optical sensor, a resistive sensor, or any other suitable sensor that can detect movement and/or positions of the magnetically sensitive particles. The sensor 64 can be configured to detect any change of magnetic field strength or distribution caused by movement of the magnetically sensitive particles. For example, the sensor 64 can be configured to detect a change from equally distributed magnetically sensitive particles to multiple clusters. The sensor 64 can be configured to detect a change from equally distributed magnetically sensitive particles to a single cluster having an arbitrary position. In some instances, the sensor 64 can detect a dynamic change of particle position.

The sensor 64 can be separately formed from the integrated circuit 62 and integrated with the integrated circuit 62 by way of packaging. The sensor 64 can be larger than the integrated circuit 62. The sensor 64 and the integrated circuit 62 can be formed by different fabrication processes. As illustrated, the sensor 64 for detecting position of magnetically sensitive particles is positioned external to the container 12 and separate from the integrated circuit 62 that includes the measurement circuit 63.

In some other embodiments, a sensor can be included within a container. According to various embodiments, a sensor can include elements on an integrated circuit that includes the measurement circuit and also elements external to the integrated circuit. In some embodiments, an integrated circuit can include both a sensor and circuitry of a measurement circuit.

The illustrated integrated circuit 62 includes the measurement circuit 63. In some other applications, circuitry of a measurement circuit can be included both on an integrated circuit and external to an integrated circuit (e.g., as one or more standalone circuit elements, on one or more other integrated circuits, etc.). The measurement circuit 63 generates an indication of an applied magnetic field based on position of the magnetically sensitive particles 14 within the container 12. The measurement circuit 63 can include any suitable circuitry to generate such an output. The measurement circuit 63 can include semiconductor devices, such as silicon devices. The measurement circuit 63 can process an output of the sensor 64 to generate the indication of the applied magnetic field. The measurement circuit 63 outputs a measurement of the applied magnetic field.

The indication of the applied magnetic field can be indicative of one or more of time of exposure to and intensity of a magnetic field, a direction of a magnetic field, an angle of a magnetic field, an intensity of a magnetic field, a rotation of a magnetic field, a profile of magnetically sensitive particles, a time domain change in a magnetic field (e.g., frequency and/or harmonics), or the like.

Figure 9:
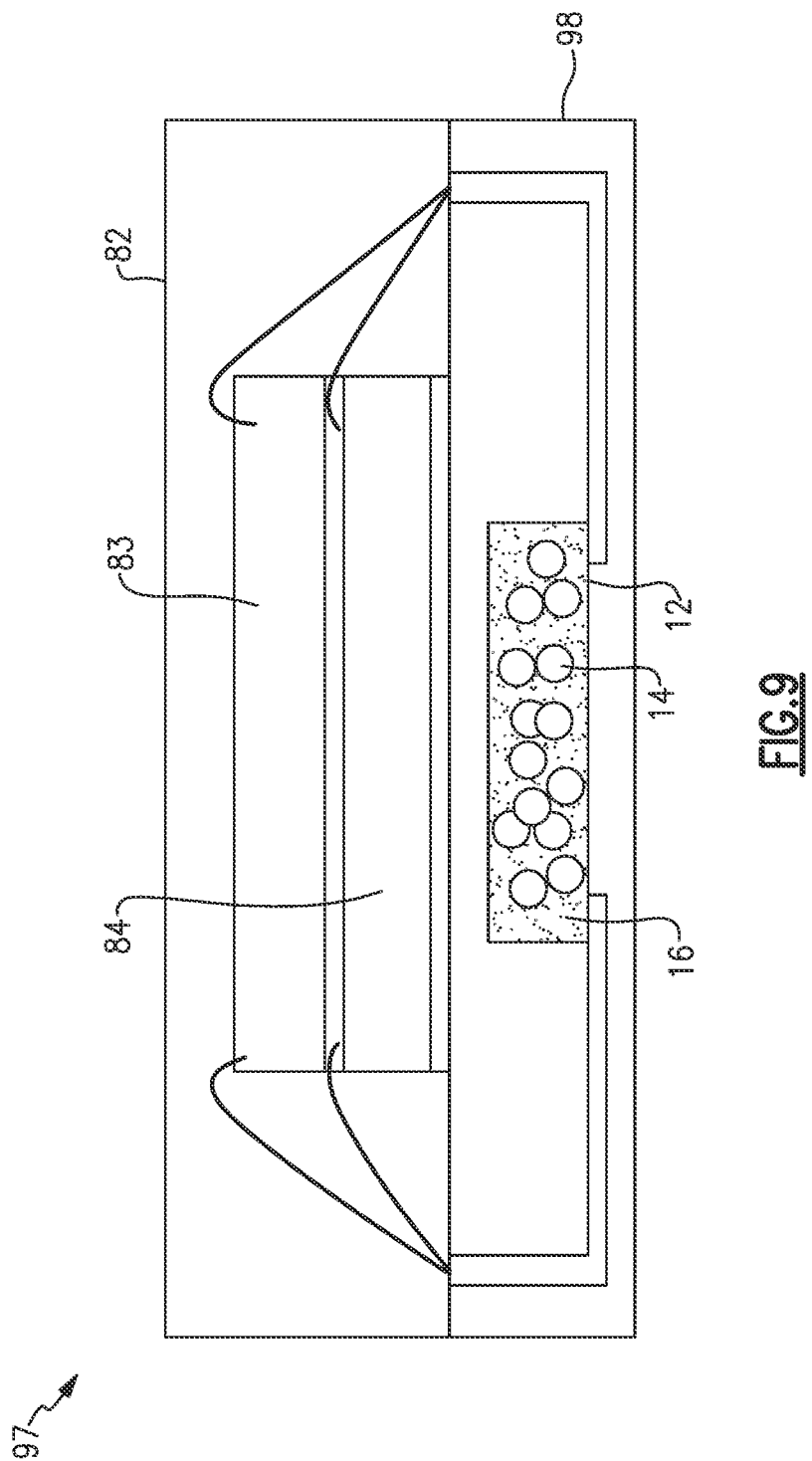
FIG. 9 is a schematic cross section of a system in a package with a container that includes particles that move in response to an applied magnetic field, where the container is encapsulated in a laminate according to an embodiment.

A container including particles can be included in a system in package (SIP). A SIP is an example of a packaged module. The container can be positioned close to a surface of a packaging structure or exposed through an opening in a packaging structure for sensing a magnetic field. In certain applications, an opening in the packaging structure can leave at least a portion of the container exposed to an external environment. The packaging structure can include a molding material, a sealed cavity or "can," or any other suitable structure to protect integrated circuits. An applied magnetic field causes particles to move within the container. A concentration of particles can produce a discernible electrical change within the system that indicates a presence/concentration of a magnetic body and/or a magnetic field. A measurement circuit of an integrated circuit of the SIP can output an indication of the magnetic field based on positions of the particles in the container. The SIPs can function in harsh environments, such as hot environments, acidic environments, or corrosive environments. FIGS. 8A to 9 illustrate example cross-sectional schematic view of SIPs according to embodiments.

FIG. 8A illustrates an SIP 80 with a container 12 with fluid 16 and magnetically sensitive particles 14 in the fluid 16. In the SIP 80, the container 12 is close to a surface of a packaging structure 82. The container 12 is stacked with a sensor 83 and an integrated circuit 84. The integrated circuit 84 includes circuitry of a measurement circuit that outputs an indication of the applied magnetic field. In certain applications, the sensor 83 is included on an integrated circuit. According to some other applications, the sensor 83 is not included on an integrated circuit. The integrated circuit 84 can be application specific integrated circuit (ASIC). The integrated circuit 84 can include a semiconductor die. The sensor 83 can be on a semiconductor die.

FIG. 8B illustrates an SIP 85 with a container 12 that is exposed through an opening in a packaging structure 86. The container 12 is exposed through a top of the SIP 85. The container 12 of the SIP 85 can be exposed to a harsh environment.

FIG. 8C illustrates an SIP 87 with a container 12 that is connected to an integrated circuit 83 though one or more intermediate layers 88. The one or more intermediate layers 88 can include one or more electrical connections between the container 12 and the integrated circuit 83, such as wiring layers in a circuit board (e.g., PCB or ceramic packaging substrate), interposer or redistribution layers (RDL). In the SIP 87, the container 12 can be exposed to a harsh environment. A packaging structure 89 covers less of the container 12 than the packaging structure 86 of the SIP 85.

FIG. 8D illustrates an SIP 90 with a container 12 that is flush with a surface of a packaging structure 92. The container 12 of the SIP 90 is exposed through an opening in the packaging structure 92.

FIG. 8E illustrates a SIP 94 with a protective layer 95 over a packaging structure 96. The protective layer 95 can protect the sensor 83 and the integrated circuit 84 from a harsh environment. The protective layer 95 can include a heat shield, stainless steel, a cooling plate, an anti-corrosive material, a hermetic shield, or the like. The protective layer 95 can protect components on the SIP 94 from a harsh environment. A container 12 can be exposed through an opening in the package structure 96 and the protective layer 95.

FIG. 9 illustrates a SIP 97 that includes a container 12 embedded in a laminate 98. The laminate 98 can be a printed circuit board. Embedding the container 12 in the laminate 98 can be useful in applications where a source of magnetic field is placed on an opposite side of the laminate 98 relative to the sensor 83 and the integrated circuit 84. In such applications, the magnetic field source could be closer to the container 12. In the SIP 97, the container 12 can be electrically connected to integrated circuit 83 and/or integrated circuit 84 by way of electrical connections in the laminate 97 and conductive features, such as through mold vias, traces, solder bumps, wire bonds, lead frames, etc., enclosed by the packaging structure 82.

An integrated system can include an opening with an embedded structure. One or more enclosures with particles that move in response to an applied magnetic field can be exposed by the opening. An integrated circuit with a measurement circuit can be integrated with the enclosure. The integrated circuit can be a processing die that includes circuitry of a measurement circuit. FIGS. 10A and 10B illustrate examples of integrated systems with enclosures containing magnetically sensitive particles according to embodiments.

FIG. 10A illustrates an integrated system 100 with an opening 102 within an embedded structure. The integrated system 100 includes containers illustrated as enclosures 104 with magnetically sensitive particles in fluid. Integrated circuits 106 of the integrated system 100 include circuitry of measurement circuits for generating an indication of the applied magnetic field. The enclosures 104 are integrated with the integrated circuits 106, such by way of embedding in a common overmold, mounting on a common packaging substrate and/or surrounding with a common enclosure (e.g., "can" with an opening or window). The enclosures 104 are positioned on opposing sides of the opening 102 in FIG. 10A.

FIG. 10B illustrates an integrated system 108 with an opening 102 within an embedded structure. The integrated system 108 includes a container in the form of an enclosure 104 with magnetically sensitive particles in fluid. Integrated circuits 106 of the integrated system 108 includes circuitry of a measurement circuit for generating an indication of the applied magnetic field. The enclosure 104 is integrated with the integrated circuit 106, such as by way of embedding in a common overmold, mounting on a common packaging substrate and/or surrounding with a common enclosure (e.g., "can" with an opening or window). The enclosure 104 is positioned at an end of the opening 102 in FIG. 10B.

Magnetic field measurement systems can wirelessly communicate with another device. Such a system can include one or more antennas that can wirelessly transmit the indication of the applied magnetic field generated by the measurement circuit. The one or more antennas can wirelessly communicate any other suitable information.

Figure 11:
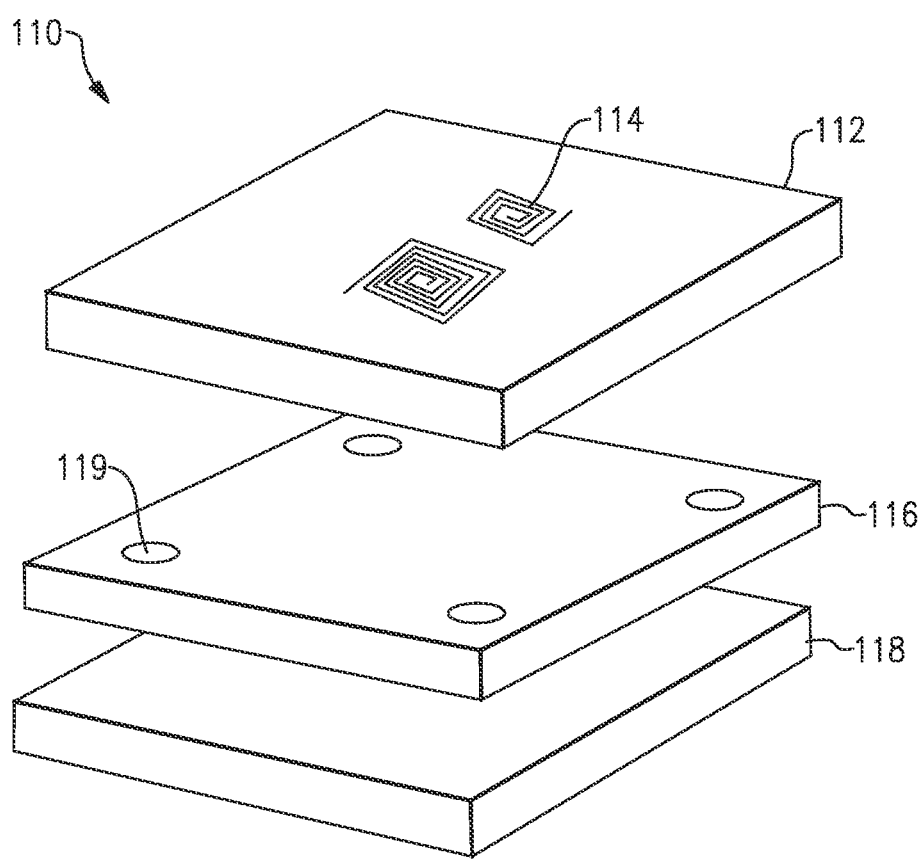
FIG. 11 illustrates an exploded schematic view of an example magnetic field measurement system with wireless communication according to an embodiment.

FIG. 11 illustrates an exploded schematic view of an example magnetic field measurement system 110 according to an embodiment. The magnetic field measurement system 110 includes a wireless communication layer 112 that includes one or more antennas 114, a layer 116 including an integrated circuit that includes circuitry of a measurement circuit, and a layer 118 that includes an enclosure with particles that move in response to an applied magnetic field in accordance with principles and advantages disclosed herein. Conductive vias 119 and/or traces can electrically connect layers of the magnetic field measurement system 110. The one or more antennas 114 can include a coil, for example. The one or more antennas 114 can be included in a radio frequency identification (RFID) tag. The wireless communication layer 112 can include circuitry to support wireless signal transmission, or such circuitry may be provided in a lower layer, such as the layer 116. The circuitry to support wireless signal transmission can encrypt data for wireless signal transmission. The one or more antennas 114 can transmit encrypted data.

Figure 12:
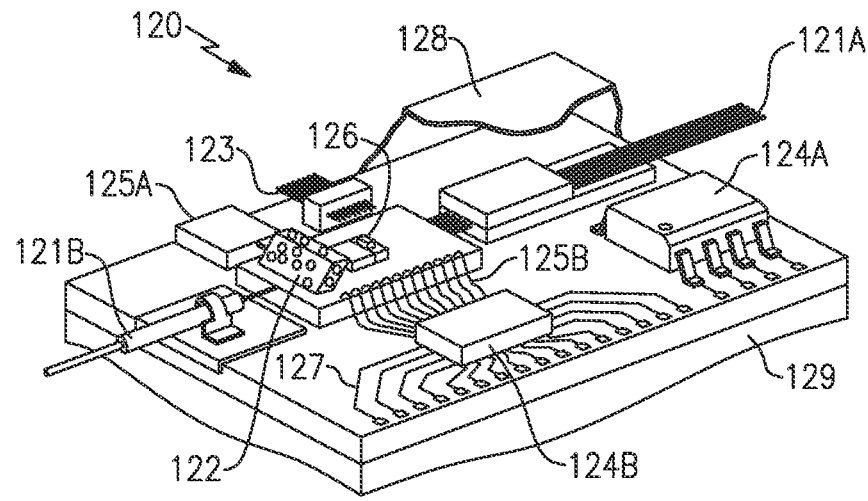
FIG. 12 is a schematic isometric view of a photonic module that includes an enclosure with particles that move in response to an applied magnetic field according to an embodiment.

Containers with particles that move in response to an applied magnetic field can be included in various modules. FIG. 12 illustrates photonic module 120 that includes a container in the form of an enclosure 122 with particles that move in response to an applied magnetic field according to an embodiment. As the particles change position depending on external magnetic fields, photodetectors and/or optical fibers can detect this change and transfer data to an integrated circuit 124A. A light source 126, such as a laser, can be used in optical detection of particles within the enclosure 122. The integrated circuit 124 includes circuitry of a measurement circuit. The photonic module 120 can include one or more of optical fibers 121A, lensed optical fibers 121B, micro-optics 123, phonic wire bonds 125A, wire bonds 125B, a flip chip integrated circuit 124B, high speed electrical interposers 127, a packaging structure 128, and a thermal management system that can include microfluidics 129.

Figure 13:
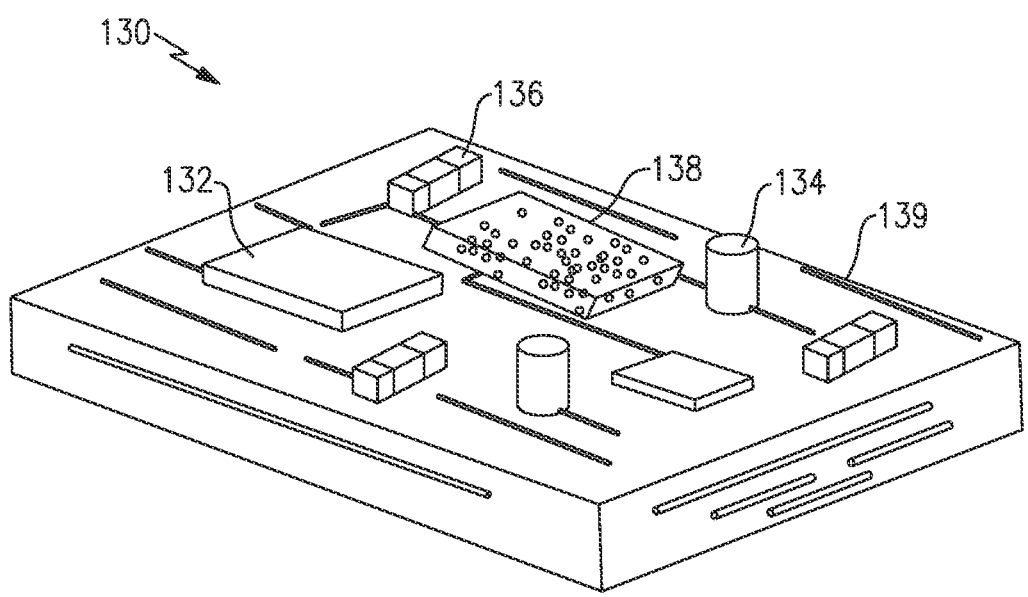
FIG. 13 is a schematic isometric view of an electronic module with electronic elements and an enclosure with particles that move in response to an applied magnetic field according to an embodiment.

FIG. 13 illustrates an electronic module 130 with electronic elements 132, 134, and 136 and an enclosure 138 with particles that move in response to an applied magnetic field according to an embodiment. The electronic elements 132, 134, and 136 and the enclosure 138 are integrated by mounting and electrical connection to a common circuit board 139. The electronic elements include an integrated circuit 132 with circuitry of a measurement circuit. The electronic elements can also include a sensor that provides an output to the measurement circuit. A module, system, or SIP can also include circuitry that encrypts the output of the sensor.

Magnetic Field Measurement Embodiments

Position and/or movement of particles can be measured in a variety of different ways. Without limitation, example measurements include case conductance measurements, zero-power direction detection measurements, cumulative magnetic field exposure detection measurements, microelectromechanical systems based measurement, optical measurements, and capacitive measurements. Example measurement systems and methods are discussed with reference to FIGS. 14A to 26. These measurement systems can include particles and containers in accordance with any suitable principles and advantages disclosed herein. Any suitable principles and advantages of the measurement systems disclosed herein can be implemented together with each other.

Positions of particles can be determined based on a conductive case measurement. A container enclosing fluid can be partially or completely conductive. A plurality of contacts can be provided on the container for taking a measurement associated with particle location.

Figure 14B:
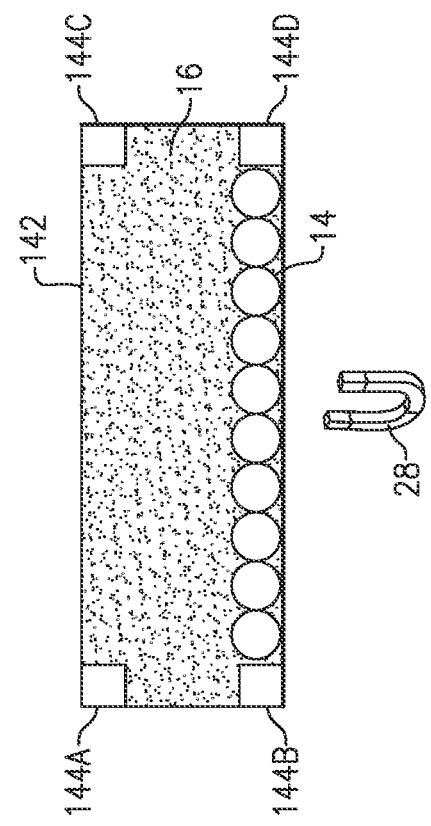
FIGS. 14A, 14B, and 14C are schematic side or cross-sectional views of an example system for detecting a magnetic field based on case conductance according to an embodiment.
Figure 14C:
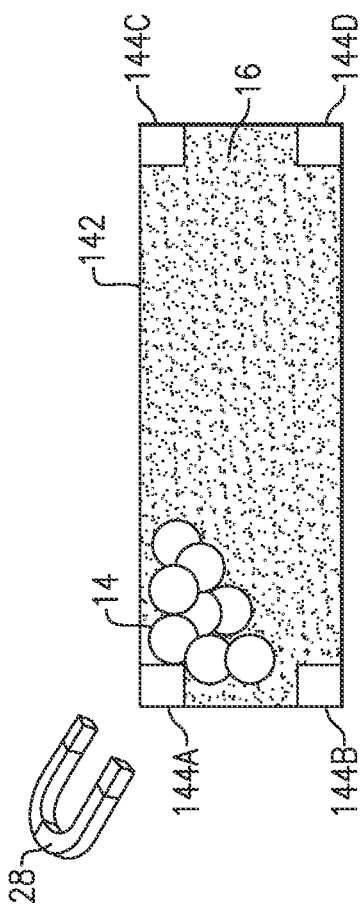
Figure 14A:
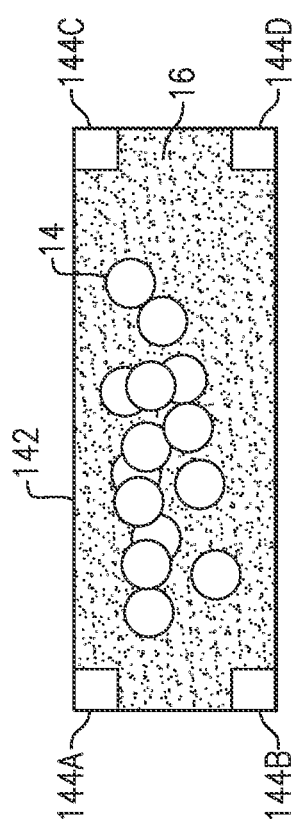

FIGS. 14A, 14B, and 14C illustrate an example system where positions of particles can be measured by a case conductance measurement according to an embodiment. A container 142 enclosing a fluid 16 and magnetically sensitive particles 14 can be metallic. A plurality of metal contacts 144A, 144B, 144C, and 144D are included on the container 142. As illustrated, the metal contacts 144A, 144B, 144C, and 144D are positioned on corners of the container 142. A case conductance can be measured using a measurement circuit connected to the metal contacts 144A, 144B, 144C, and 144D. For example, impedance can be measured by applying a voltage to one or more of the metal contacts 144A, 144B, 144C, and 144D and measuring current. This measurement is indicative of positions of the magnetically sensitive particles 14 within the container 142. Case conductance can also be measured for non-magnetically sensitive particles in magnetically sensitive fluid.

A baseline case conductivity of the container 142 can be known. The system can be calibrated. For example, the magnetically sensitive particles 14 can be positioned as shown in FIG. 14A when no magnetic field is being applied, and the conductivity between each combination of two contacts 144A, 144B, 144C, 144D can be measured. Note that these baseline conductivities can be influenced by the materials of the container 142 (e.g., glass) and fluid 16. The magnetically sensitive particles 14 can align relative to a magnetic field and/or lines of flux.

A magnetic field source 28 can apply a magnetic field to cause the magnetically sensitive particles 14 to move to the positions shown in FIG. 14B. A change in resistivity can indicate positions of the magnetically sensitive particles. By measuring current using metal contacts 144A, 144B, 144C, 144D, positions of the magnetically sensitive particles 14 can be determined based on the change in resistivity or conductivity due to movement of the magnetically sensitive particles 14 from the positions shown in FIG. 14A to the positions shown in FIG. 14B. This change in resistivity or conductivity is indicative of the magnetic field applied by the magnetic field source 28. In particular, strength, a direction, and/or location of the applied magnetic field can be determined by comparing the measurements under influence of the magnetic field source 28 against the baseline measurements.

The magnetic field source 28 can apply a magnetic field to cause the magnetically sensitive particles 14 to move to the positions shown in FIG. 14C. By measuring current using metal contacts 144A, 144B, 144C, 144D, positions of the magnetically sensitive particles 14 can be determined based on the change in resistivity due to movement of the magnetically sensitive particles 14 from the positions shown in FIG. 14A to the positions shown in FIG. 14C. This change in resistivity is indicative of the magnetic field applied by the magnetic field source 28. A strength, direction and/or location of the applied magnetic field can be determined.

Magnetically sensitive particles with different properties can be used in case conductance measurements to determine an intensity of an applied magnetic field. For example, magnetically sensitive particles with different densities, different sizes, and/or different weights can be used to determine intensity of an applied magnetic field.

FIGS. 15A, 15B, and 15C illustrate a system for detecting magnetic field intensity with case conductance measurement according to an embodiment. Magnetically sensitive particles 14A, 14B, and 14C can be distributed in fluid 16 within container 142 depending on size of the magnetically sensitive particles 14A, 14B, and 14C.

A magnetic field source 28A can apply a magnetic field having a first intensity. This can cause magnetically sensitive particles 14A to come in contact with a surface of the container 142 as shown in FIG. 15B. The magnetic field applied by the magnetic field source 28A is not sufficiently strong to bring the magnetically sensitive particles 14B and 14C in contact with the container 142. The applied magnetic field can compete with gravity so that only lighter magnetically sensitive particles 14A are attracted with the magnetic field having the first intensity. In some other applications, a plurality of types (e.g., 3 types) of magnetically sensitive particles can each have one or more different magnetic properties (such as permeability (or susceptibility), coercivity and/or remanence) such that they are more or less attracted by an external magnetic field.

A magnetic field source 28B can apply a magnetic field having a second intensity. This can cause magnetically sensitive particles 14A and 14B to come in contact with a surface of the container 142 as shown in FIG. 15C. The magnetic field applied by the magnetic field source 28C is not sufficiently strong to bring the magnetically sensitive particles 14C in contact with the container 142. The applied magnetic field can compete with gravity so that only magnetically sensitive particles 14A and 14B are attracted with the magnetic field having the second intensity.

Using metal contacts 144A and 144B, a measurement circuit can generate a case conductance measurement. A case conductance measurement corresponding to FIG. 15B indicates a magnetic field having a lower intensity than a case conductance measurement corresponding to FIG. 15C. It will be understood that fields with yet higher intensities beyond a different threshold can additionally attract the more massive particles 14C. While not shown, more than two metal contacts can be employed at different locations across the container 142. The apparatus can be calibrated for different magnetic field intensities to be indicated by different conductance measurements.

In some embodiments, systems disclosed herein can perform zero-power detection of exposure to a high magnetic field or magnetic field interference. With zero-power detection, a device does not need power to be applied during exposure to the external field in order to detect the magnetic field. Rather, power can be applied at a later stage while interrogating the system to take a measurement of the state of the system (or an external optical detection system can be used to detect clusters/movement of particles), but the system can maintain its status from the prior exposure without power until the later interrogation.

Figure 16C:
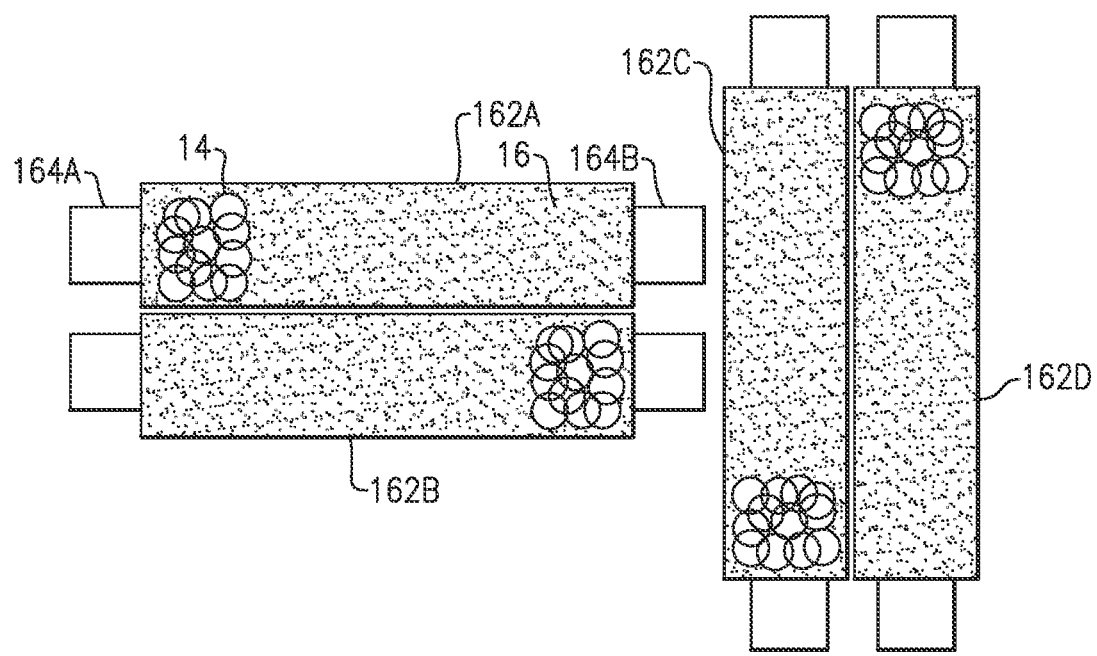

FIGS. 16A to 16F illustrate enclosures with particles that can be used for zero-power detection according to an embodiment. FIG. 16A illustrates an example enclosure 162 with biasing magnets 164A and 164B on opposing ends. The enclosure 162 is a sealed enclosure containing fluid 16 and magnetically sensitive particles 14 in the fluid 16. The enclosure 162 is pre-loaded with the magnetically sensitive particles 14 in an initial position as shown in FIG. 16A. In the illustrated initial position, the magnetically sensitive particles 14 are positioned at one end of the enclosure 162 by the biasing magnet 164A. The biasing magnet 164A can attract the magnetically sensitive particles to the initial position. If undisturbed, the magnetically sensitive particles 14 can stay in the initial position. Zero-power detection techniques can be applied to non-magnetically sensitive particles in magnetically sensitive fluids in certain applications.

FIG. 16B illustrates the magnetically sensitive particles 14 after a large magnet 165 (representative of any source of external magnetic field) causes the magnetically sensitive particles 14 to move from one end of the enclosure 162 to an opposite end of the enclosure. The large magnet 165 applies a larger magnetic field than the biasing magnets 164A and 164B. The biasing magnet 164B can retain the magnetically sensitive particles 14 in the position shown in FIG. 16B until a sufficiently large magnetic field moves the magnetically sensitive particles 14. Accordingly, the magnetically sensitive particles 14 can remain in the position shown in FIG. 16B after the large magnet 165 no longer applies a strong magnetic field. Power need not be applied at the time of the exposure for measurement. Rather, power can be later applied for measurement, even in the absence of the field, because the system maintains the status from the exposure without power.

A plurality of enclosures 162 can together be used to determine exposure to a magnetic field in a direction in space. For example, 4 enclosures 162 positioned relatively close to each other with a proper initial state of magnetically sensitive particles can record and store an indication of exposure to a relatively large magnetic field in a direction in an xy-plane. As another example, 6 enclosures 162 can be used to detect a magnetic field in the xyz-space.

FIG. 16C illustrates 4 enclosures 162A, 162B, 162C, 164D each including magnetically sensitive particles 14 in fluid 16 in an initial position according to an embodiment. The enclosures 162A, 162B, 162C, 164D can together be used to detect a magnetic field in a direction in an xy-plane. In the initial position, two enclosures are oriented along a direction with magnetically sensitive particles starting at opposing ends of the enclosures. Enclosures 162A and 162B are oriented along a first direction with magnetically sensitive particles 14 positioned at opposite ends. Enclosures 162C and 162D are oriented along a second direction with magnetically sensitive particles 14 positioned at opposite ends. As illustrated, the first and second directions are orthogonal. Each of the enclosures 162A, 162B, 162C, 164D can have integrated biasing magnets 164A and 164B and contain magnetically sensitive particles 14 and fluid 16. Reference numbers of these elements are included for the enclosure 162A and omitted for the other enclosures in FIGS. 16C, 16D, 16E, and 16F.

FIG. 16D illustrates the 4 enclosures 162A, 162B, 162C, 164D from FIG. 16C after exposure to a magnetic field. The magnetically sensitive particles 14 in enclosure 162C have moved from the initial position shown in FIG. 16C. This indicates exposure to a magnetic field from the direction where the magnetically sensitive particles 14 have moved to in the enclosure 162C. The positions of the magnetically sensitive particles 14 in the enclosures 162C and 162D shown in FIG. 16D together indicate a direction from which a magnetic field was applied. Any suitable detection technique can be used to determine positions of the magnetically sensitive particles 14 in the enclosures 162A, 162B, 162C, and 162D. A measurement circuit can output an indication of the applied magnetic field based on the detected positions of the magnetically sensitive particles in enclosures 162A, 162B, 162C, and 162D.

FIG. 16E illustrates the 4 enclosures 162A, 162B, 162C, 164D from FIG. 16C after exposure to a magnetic field from a different direction than in FIG. 16D. The magnetically sensitive particles 14 in enclosure 162B have moved from the initial position shown in FIG. 16C. This indicates exposure to a magnetic field from the direction where the magnetically sensitive particles 14 have moved to in the enclosure 162B. The positions of the magnetically sensitive particles 14 in the enclosures 162A and 162B shown in FIG. 16E together indicate the direction from which a magnetic field was applied.

FIG. 16F illustrates the 4 enclosures 162A, 162B, 162C, 164D from FIG. 16E after exposure to magnetic fields from an opposite direction than in FIG. 16E. Two magnetic fields have been applied to bring the magnetically sensitive particles 14 to the position in shown in FIG. 16E relative to the initial position in FIG. 16C. The magnetically sensitive particles 14 in enclosures 162A and 162B have moved from the position shown in FIG. 16E to an opposite end of these enclosures. This indicates exposure to a magnetic field from the direction where the magnetically sensitive particles 14 have moved to in the enclosures 162A and 162B. The positions of the magnetically sensitive particles 14 in the enclosures 162A and 162B shown in FIG. 16F together indicate the direction from which a magnetic field was applied. Applying magnetic fields in two opposite directions does not bring the magnetically sensitive particles in the enclosures 162A, 162B, 162C, 164D back to the initial position shown in FIG. 16C.

Cumulative magnetic field exposure can be determined based on positions of particles in a container. Systems can register if magnetic field exposure has exceeded a certain threshold in a passive way. Whether a device has been exposed to a relatively strong magnetic field can be detected even after the relatively strong magnetic field has been applied. Cumulative magnetic field exposure detection can be performed using magnetically sensitive particles in fluid or with non-magnetically sensitive particles within a magnetically sensitive fluid.

FIGS. 17A and 17B illustrate a system with cumulative magnetic field exposure detection according to an embodiment, which can be a measure of magnetic field "dose" or field strength integrated over time. The system includes an enclosure 172 including a flow restriction structure 174 that impedes passage of magnetically sensitive particles 14 therethrough. The flow restriction structure 174 can be semipermeable such that it is easier for particles to flow in one direction than in the opposite direction. The flow restriction structure 174 can be a membrane. The flow restriction structure 174 can be a filter. In some embodiments, the flow restriction structure 174 can simply be a constriction of flow path cross section. The magnetically sensitive particles 14 can be in an initial position shown in FIG. 17A. A magnetic field source 18 applying a sufficiently strong magnetic field can cause at least some of the magnetically sensitive particles 14 to pass through the flow restriction structure 174. Then the magnetically sensitive particles 14 that have passed through the flow restriction structure 174 can be detected. Such detection can involve optical detection or any other suitable detection mechanism depending on the application.

FIG. 17B illustrates a state where some of the magnetically sensitive particles 14 have passed through the flow restriction structure 174. Based on the positions of magnetically sensitive particles 14 that have passed through the flow restriction structure 174, a measurement circuit can generate an indication of a cumulative magnetic field exposure. The measurement can be generated after the sufficiently strong magnetic field is applied. The measurement can be generated while no magnetic field is being applied.

Magnetically sensitive particles can interact with microelectromechanical systems (MEMS) structures. MEMS structures can include magnetic material. Example MEMS structures include a see saw structure including magnetically sensitive material, a cantilever beam including magnetically sensitive material, a movable MEMS mass that includes magnetically sensitive material, a diaphragm or MEMS microphone including magnetic material, a MEMS gyroscope with magnetic material, and the like. MEMS structures can detect positions of magnetically sensitive materials in a container in certain applications. MEMS structures can apply a magnetic field to cause magnetically sensitive particles to move within a container in some applications. An external magnetic field source, a MEMS structure including magnetically sensitive material, and magnetically sensitive particles can interact. MEMS structures can be used for detecting positions of (1) magnetically sensitive particles within fluid and/or (2) non-magnetically sensitive particles within a magnetically sensitive fluid. For example, a MEMS structure can be part of an antenna such that the antenna changes depending on the intensity of the field and a transponder can detect the change in the antenna.

Figure 18:
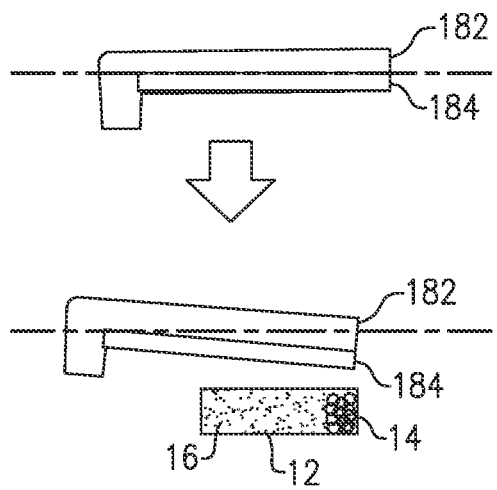
FIGS. 18, 19, and 20 illustrate example microelectromechanical systems structures interacting with magnetically sensitive particles within a container according to embodiments.
Figure 19:
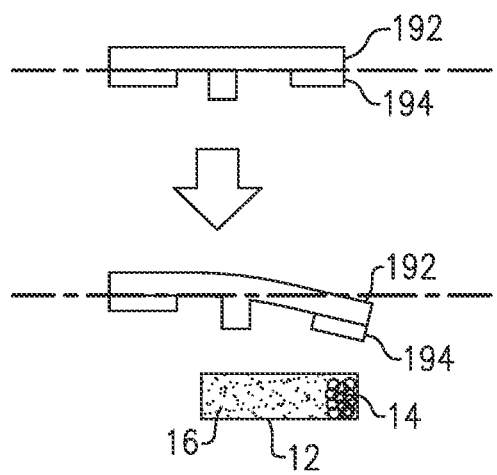
Figure 20:
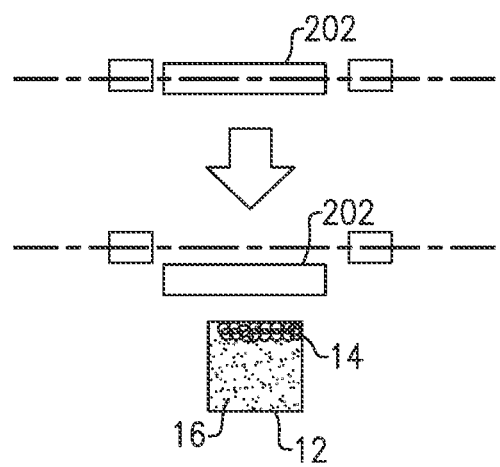

FIGS. 18, 19, and 20 illustrate example MEMS structures interacting with particles within a container according to embodiments. FIG. 18 illustrates a cantilever beam MEMS structure 182 and a container 12 with magnetically sensitive particles 14 in fluid 16. The cantilever beam MEMS structure 182 can include a magnetically sensitive layer 184 and be incorporated within silicon. The cantilever beam MEMS structure 182 can move in response to positions of magnetically sensitive particles 14 within a container 12. The position of the cantilever beam MEMS structure 182 can be used to sense an applied magnetic field. A measurement circuit connected to the cantilever beam MEMS structure 182 can generate an output signal indicative of the applied magnetic field.

FIG. 19 illustrates a see saw MEMS structure 192 and a container 12 with magnetically sensitive particles 14 in fluid 16. The see saw MEMS structure 192 can incorporate magnetically sensitive material 194. The see saw MEMS structure 192 can move in response to positions of magnetically sensitive particles 14 within a container 12. The position of the see saw MEMS structure 192 can be used to sense an applied magnetic field. A measurement circuit connected to the see saw MEMS structure 192 can generate an output signal indicative of the applied magnetic field.

FIG. 20 illustrates a moveable mass MEMS structure 202 and a container 12 with magnetically sensitive particles 14 in fluid 16. The moveable mass MEMS structure 202 can incorporate magnetically sensitive material 204 and be tethered. The moveable mass MEMS structure 202 can move in response to positions of magnetically sensitive particles 14 within a container 12. The position of the moveable mass MEMS structure 202 can be used to sense an applied magnetic field. A measurement circuit connected to the moveable mass MEMS structure 202 can generate an output signal indicative of the applied magnetic field.

Magnetic sensors can be integrated with a container to sense positions of magnetically sensitive particles. Examples of such magnetic sensors include magnetoresistive sensors (for example, anisotropic magnetoresistance sensors, giant magnetoresistance sensors, or tunnel magnetoresistance sensors), fluxgate sensors, Hall effect sensors, search-coil sensors, giant magnetic impedance (GMI) sensors, and the like.

Figure 21A:
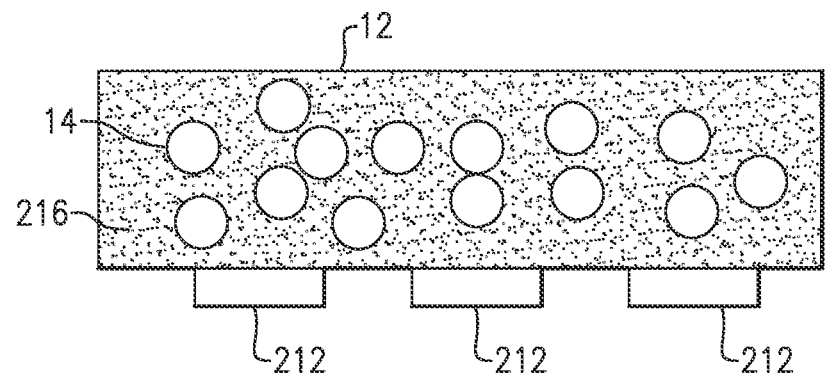
FIGS. 21A and 21B are schematic side or cross-sectional views of a container with magnetically sensitive particles in a phase change material, wherein the container has integrated magnetic sensors according to an embodiment.
Figure 21B:
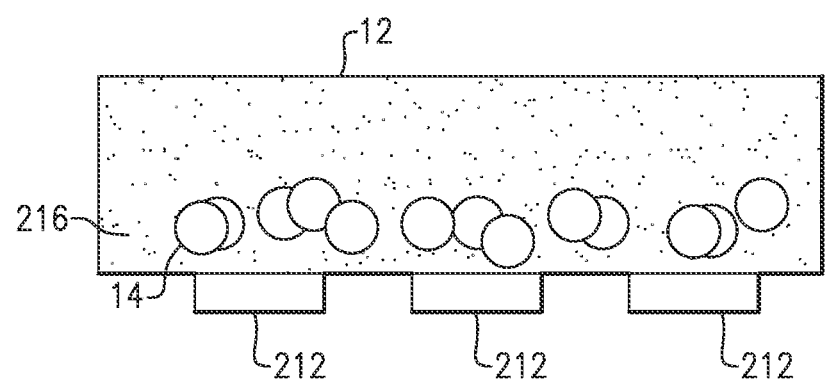

FIGS. 21A and 21B illustrate a container 12 with integrated magnetic sensors 212 according to an embodiment. The magnetic sensors 212 can be an array of magnetic sensors, such as a one dimensional array, a two dimensional array or a three dimensional array. As illustrated, the magnetic sensors 212 are positioned on an outer surface of the container 12. The container 12 includes a material 216 and particles 14. The particles 14 can be electrically conductive. The magnetic sensors 212 can sense positions of the particles 14 within the container. Depending on the magnetic material used in a particular application, a biasing field can be present for particle detection.

The material 216 can be a gel or fluid with different physical states at different temperatures. For example, the material 216 can be solid at room temperature and liquid at a higher temperature. At a higher temperature, the magnetically sensitive particles 14 can move in the material 216. For instance, wax, coconut oil, or fat are example materials that are solid at room temperature and liquid at higher temperatures. The material 216 can be used in accordance with any suitable principles and advantages of any of the magnetic field measurement systems disclosed herein. For example, the material 216 can be used with MEMS based sensors, capacitive sensors, optical sensors, case conductance measurement, zero-power detection, cumulative magnetic field exposure, or the like.

FIG. 21B illustrates a state where the material 216 is at a higher temperature than in FIG. 21A and the magnetically sensitive particles 14 have a higher mobility in the material 216 than in FIG. 21A. A magnetic field can be applied to move the magnetically sensitive particles 14 to the positions shown in FIG. 21B. The magnetic sensors 212 can detect the positions of the magnetically sensitive particles 14. A measurement circuit connected to the magnetic sensors 212 can output an indication of the applied magnetic field.

Figure 22:
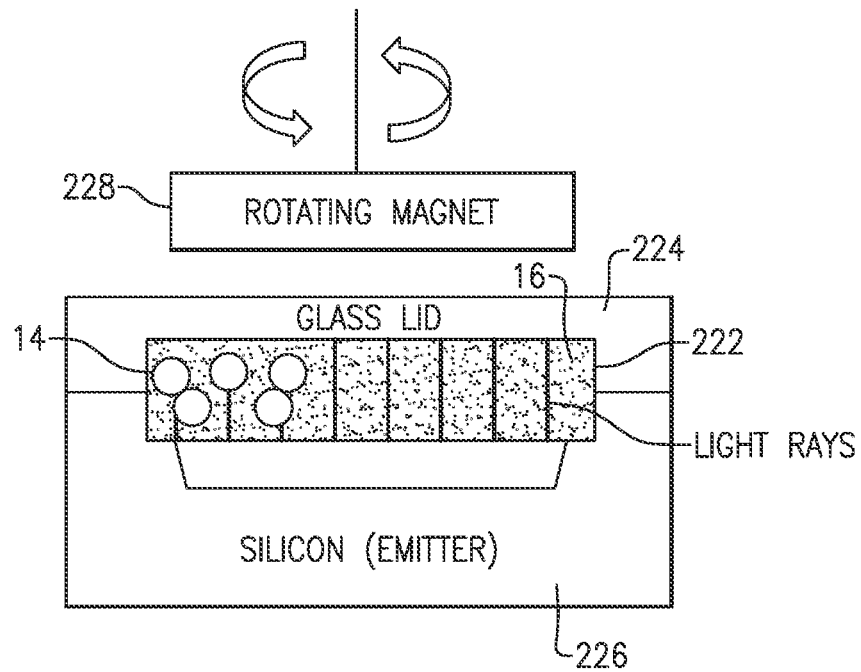
FIG. 22 is a schematic cross section of a container with magnetically sensitive particles with optical detection according to an embodiment.
Figure 23:
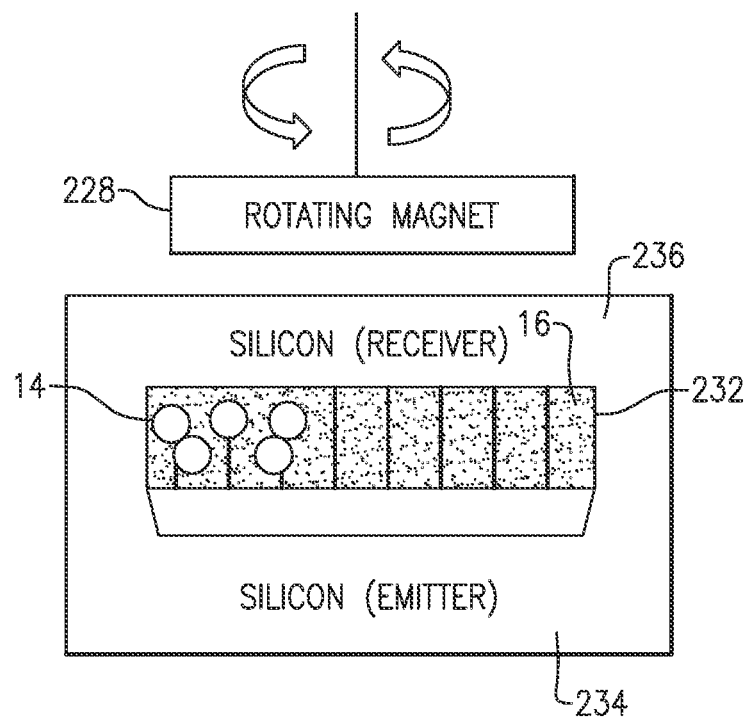
FIG. 23 is a schematic cross section of a container with magnetically sensitive particles with optical detection according to another embodiment.

Positions of particles can be detected optically. As a magnet rotates, particles within fluid can move with the rotation of the magnet and affect light transmission patterns inside the enclosure. With optics, rotation of the magnetic field can be determined. Optical detection can detect displacement and/or position of magnetically sensitive particles based on any suitable movement of a magnetic body or other magnetic field source. Example movements include rotation as discussed with reference to FIGS. 22 and 23 and linear motion. Optical detection is also applicable to stationary magnets or magnetic field sources. Optical detection can be a power efficient and relatively fast method of detecting magnetically sensitive particles. Example embodiments with optical detection are shown in FIGS. 22 and 23. Optical detection can be used for detecting positions of (1) magnetically sensitive particles within fluid and/or (2) non-magnetically sensitive particles within a magnetically sensitive fluid.

FIG. 22 illustrates a container 222 with magnetically sensitive particles 14 with optical detection. The container 222 includes a glass lid 224. A silicon emitter 226 integrated with the container 222 can emit light to the container 222. A rotating magnet 228 can cause the magnetically sensitive particles 14 to move. As the magnetically sensitive particles 14 move within fluid 16, detection of the light rays can change. For example, the magnetically sensitive particles 14 can block or otherwise adjust the path of light emitted from the emitter 226. The change in distance of the light rays can be detected with an optical detector (not illustrated) that is positioned over the glass lid 224 and used to calculate where the magnetically sensitive particles 14 have moved.

FIG. 23 illustrates a container 232 with particles 14 with integrated optical detection. The container 232 includes an integrated emitter 234 and an integrated receiver 236. The emitter 234 and the receiver 236 can each include silicon or another suitable semiconductor. The position of the magnetically sensitive particles 14 can be detected based on the light rays emitted by the emitter 234 and received by the receiver 236. The light rays can have any suitable wavelength for detection. For example, the light rays can be infrared rays. The positions of the magnetically sensitive particles 14 are indicative of rotation of the magnetic field cause by the rotating magnet 228 in FIG. 23. More generally, optical detection can determine positions of particles moved in response to a magnetic field. In some instances, light sensitive metal pads can be included on a light receiver.

Figure 24A:
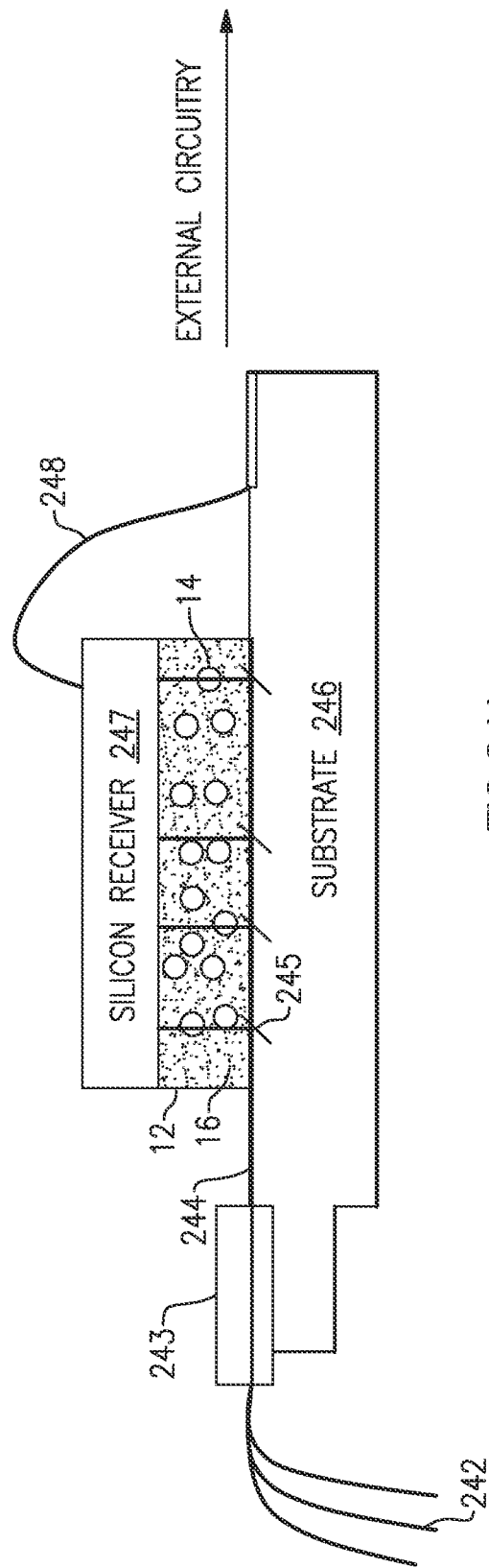
FIGS. 24A and 24B are schematic cross sectional or side views of optical measurement systems according to embodiments.
Figure 24B:
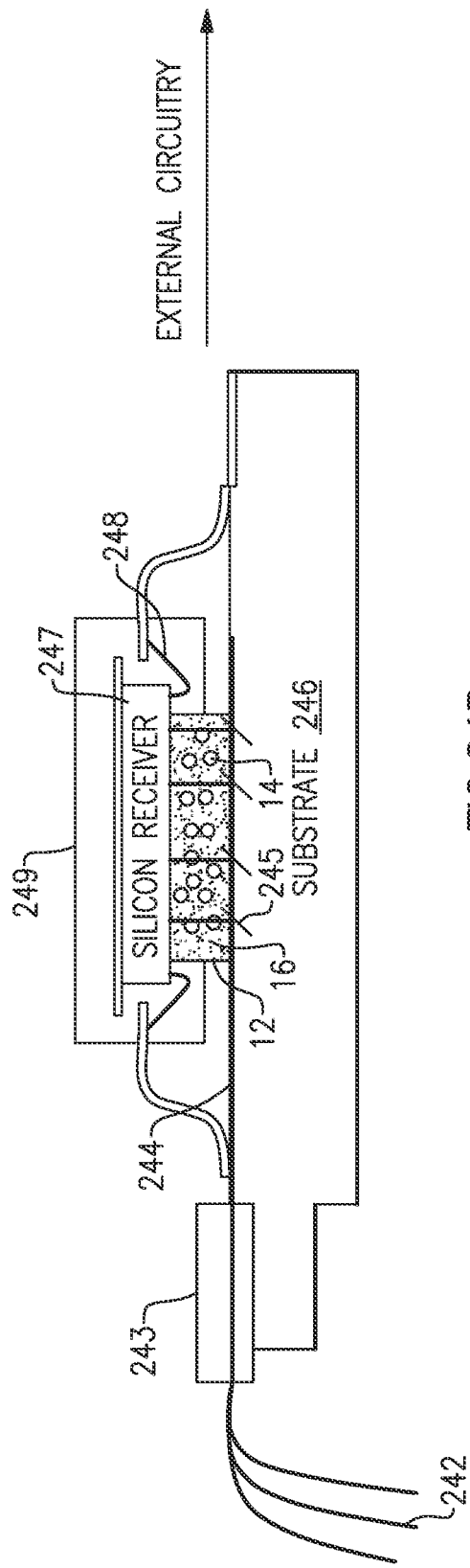

FIGS. 24A and 24B are schematic cross sectional or side views of optical measurement systems according to embodiments. The optical measurement systems can include fiber optic cables/sources 242, an optical edge coupler 243, waveguides 244, an angled gradient 245, particles 14 within a container 12 on a substrate 246, a silicon receiver 247, and an electrical path 248 (e.g., including a wire bond and/or any other suitable connections) to external circuitry. A packaging structure 249 can enclose the silicon receiver 247 and at least part of the container 12, for example, as shown in FIG. 24B. The packaging structure 249 can have an opening through which a portion of the container 12 is exposed.

FIG. 24C is a schematic view of a portion of the optical systems of FIGS. 24A and 24B. By providing light sources at multiple different positions through the container 12, and multiple light detectors (e.g., a light sensitive array) at the opposite side of the container 12, changes in positions of the particles 14 can be detected.

Figure 25:
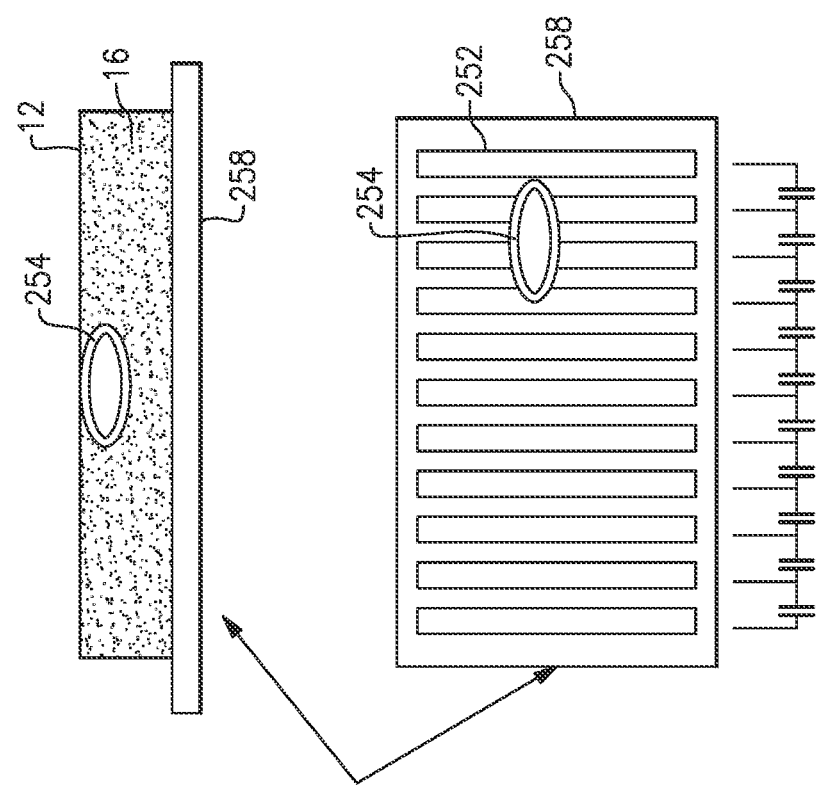
FIG. 25 illustrates schematic side and plan views of a system with one-dimensional capacitive sensing of particles within a container according to an embodiment.

The position of one or more particles can be detected with capacitive sensing. Mutual capacitance can be measured to detect position of one or more particles in fluid within a container. In some instances, mutual capacitance can be continuously measured. Velocity can be determined by differentiating the continuous measurements once. Acceleration can be determined by differentiating the continuous measurements twice. Velocity and/or acceleration can be measured based on any suitable continuous position measurements (e.g., continuous optical measurements, etc.). A capacitive sensor, such as a complementary metal oxide semiconductor capacitive sensor, can be used to detect one or more magnetically sensitive particles. FIGS. 24 and 25 illustrate embodiments of detecting position of a magnetically sensitive particle with capacitive sensing.

FIG. 25 illustrates a capacitive sensor 252 integrated with a container 12 that includes a particle 254 within fluid 16. The particle 254 can be magnetically sensitive. The particle 254 can be a bead with a conductive coating. The container 12 and the capacitive sensor 252 can be integrated with wafer level chip scale or heterogenous packaging or some other packaging technology depending on the specifications of the application. The capacitive sensor 252 can be formed in a top metal layer of an integrated circuit 258, or can be a stand-alone device fabricated with packaging technology (e.g., silk screening, sputtering, plating, printing, etc.). The capacitive sensor 252 can detect a one-dimensional position of the particle 254 based on a mutual capacitance measurement. The capacitive sensor 252 can include a one-dimensional array of capacitive sensing elements. A measurement circuit of the integrated circuit 258 can output an indication of an applied magnetic field based on the measured position.

Figure 26:
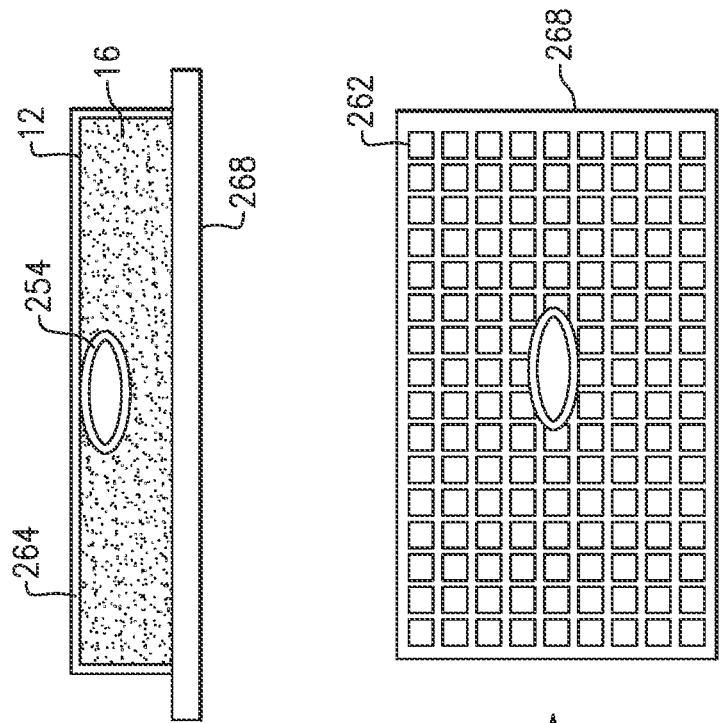
FIG. 26 illustrates schematic side and plan views of a system with two-dimensional capacitive sensing of particles within a container according to another embodiment.

FIG. 26 illustrate a capacitive sensor 262 integrated with a container 12 that includes a particle 254 within fluid 16. An electrical shield 264 can be positioned over the container 12. The capacitive sensor 262 can detect a two-dimensional position of the particle 254 based on a mutual capacitance measurement. The capacitive sensor 262 can include a two-dimensional array of capacitive sensing elements. The capacitive sensor 262 can be formed in a top metal layer of an integrated circuit 268. Alternatively, the capacitive sensor 262 can be a stand-alone device fabricated with packaging technology. A measurement circuit can output an indication of an applied magnetic field based on the measured position.

CONCLUSION

In the embodiments described above, apparatus, systems, and methods for detecting an applied magnetic field based on the position of ate least one particle within a container are described in connection with particular embodiments. It will be understood, however, that the principles and advantages of the embodiments can be used for any other systems, apparatus, or methods with a need for magnetic field detection.

The principles and advantages described herein can be implemented in various apparatuses. Examples of such apparatuses can include, but are not limited to, consumer electronic products, parts of the consumer electronic products, electronic test equipment, vehicular electronic products, industrial electronic products, etc. Examples of parts of consumer electronic products can include clocking circuits, analog-to-digital converts, amplifiers, rectifiers, programmable filters, attenuators, variable frequency circuits, etc. Examples of the electronic devices can include memory chips, memory modules, circuits of optical networks or other communication networks, and disk driver circuits. Electronic products can include, but are not limited to, wireless devices, a mobile phone (for example, a smart phone), cellular base stations, a telephone, a television, a computer monitor, a computer, a hand-held computer, a tablet computer, a laptop computer, a wearable computing device, a vehicular electronics system, a microwave, a refrigerator, a stereo system, a digital video recorder (DVR), a digital music players, a radio, a camera, a digital camera, a portable memory chip, a washer, a dryer, a washer/dryer, a copier, a facsimile machine, a scanner, a wrist watch, a smart watch, a clock, a wearable health monitoring device, etc. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments. The acts of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A system for magnetic field measurement, the system comprising:
   a container;
   at least one particle within the container, wherein the at least one particle moves within the container in response to a magnetic field; and
   a measurement circuit configured to output an indication of the magnetic field based on position of the at least one particle, wherein the measurement circuit comprises circuitry of an integrated circuit, and wherein the integrated circuit is co-packaged with the container.

2. The system of claim 1, wherein the at least one particle comprises a magnetically sensitive particle within a fluid.

3. The system of claim 2, wherein the magnetically sensitive particle is micrometer scale or larger.

4. The system of claim 2, wherein mobility of the magnetically sensitive particle in the fluid is different above a defined temperature relative to below the defined temperature.

5. The system of claim 1, wherein the at least one particle is in a magnetically sensitive fluid.

6. The system of claim 1, wherein the at least one particle comprises a magnetically sensitive particle embedded in a film.

7. The system of claim 1, wherein the container is a sealed enclosure.

8. The system of claim 1, further comprising a sensor configured to provide an output signal to the measurement circuit, the sensor arranged to detect the at least one particle in a particular area of the container.

9. The system of claim 8, wherein the sensor comprises at least one of a magnetic sensor, a capacitive sensor, or a microelectromechanical systems device.

10. The system of claim 1, wherein the container comprises a conductive case, and the measurement circuit is configured to measure case conductance.

11. The system of claim 1, wherein the measurement circuit is included in an optical measurement system, and the container comprises an optical window through which the optical measurement system is configured to detect the at least one particle.

12. The system of claim 1, wherein the system is a packaged module comprising a packaging structure, and an opening in the packaging structure leaves at least a portion of the container exposed.

13. The system of claim 1, further comprising a magnetic structure integrated with the container.

14. The system of claim 1, further comprising an antenna configured to wirelessly transmit information associated with the magnetic field.

15. The system of claim 1, wherein the at least one particle comprises a plurality of particles.

16. A system in a package (SIP) with magnetic field measurement, the SIP comprising:
    a container;
    at least one particle within the container, wherein the at least one particle moves within the container in response to a magnetic field;
    a measurement circuit configured to output an indication of the magnetic field based on position of the at least one particle; and
    a packaging structure enclosing the measurement circuit and comprising an opening, wherein at least a portion of the container is exposed by the opening.

17. The SIP of claim 16, further comprising a protective layer over at least part of the packaging structure.

18. A system for magnetic field measurement, the system comprising:
    a container;
    at least one particle within the container, wherein the at least one particle moves within the container in response to a magnetic field; and
    means for measuring the magnetic field based on position of the at least one particle, the means for measuring being co-packaged with the container.

19. The system of claim 1, wherein the container comprises a conductive structure, and the measurement circuit is electrically connected to the conductive structure of the container.

20. The SIP of claim 16, further comprising a sensor configured to detect the at least one particle and provide an output signal to the measurement circuit, the packaging structure enclosing the sensor.

* * * * *